(12) United States Patent
Berman et al.

(10) Patent No.: US 11,387,848 B1
(45) Date of Patent: Jul. 12, 2022

(54) HIERARCHICAL ERROR CORRECTION CODE

(71) Applicant: SAMSUNG ELECTRONICS CO., LTD., Suwon-si (KR)

(72) Inventors: Amit Berman, Haifa (IL); Ariel Doubchak, Herzliya (IL)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/198,528

(22) Filed: Mar. 11, 2021

(51) Int. Cl.
*H03M 13/00* (2006.01)
*H03M 13/37* (2006.01)
*H03M 13/29* (2006.01)
*G06F 11/10* (2006.01)
*H03M 13/15* (2006.01)

(52) U.S. Cl.
CPC ..... *H03M 13/3707* (2013.01); *G06F 11/1068* (2013.01); *H03M 13/152* (2013.01); *H03M 13/1515* (2013.01); *H03M 13/2909* (2013.01)

(58) Field of Classification Search
None
See application file for complete search history.

(56) References Cited

U.S. PATENT DOCUMENTS 8,850,296 B2 * 9/2014 Weingarten ......... H03M 13/152
714/781
10,797,728 B1 * 10/2020 Varnica ............. H03M 13/3707

2009/0241008 A1 * 9/2009 Kim ................. H03M 13/2903
714/755
2009/0241009 A1 * 9/2009 Kong .................... H03M 13/03
714/763
2010/0253555 A1 * 10/2010 Weingarten ....... H03M 13/2906
341/51

(Continued)

OTHER PUBLICATIONS

J. Spinner and J. Freudenberger, "A decoder with soft decoding capability for high-rate generalized concatenated codes with applications in non-volatile flash memories," 2017 30th Symposium on Integrated Circuits and Systems Design (SBCCI), 2017, pp. 185-190. (Year: 2017).*

(Continued)

*Primary Examiner* — Daniel F. McMahon
(74) *Attorney, Agent, or Firm* — F. Chau & Associates, LLC

(57) ABSTRACT

Embodiments of the present disclosure provide a controller hierarchical decoding architecture. For instance, multiple decoder hierarchies are implemented along with use of hierarchies of codes with locality (e.g., larger code length of a hierarchy is composed of local codes from a lower hierarchy). The hierarchical Error Correction Code (ECC) decoding includes multiple hierarchies such as a first hierarchy, a second hierarchy, and additional hierarchies as needed. A first hierarchy includes low-complexity ECC engines, each connected to a NAND channel for computing local codes of low code lengths. A second hierarchy includes higher complexity ECC engines that shares several NAND channels for correcting corrupt data using relatively larger code length (e.g., and the higher complexity ECC engines of the second hierarchy performs decoding operations using more complex decoding algorithms). The larger code length is composed of local codes from a previous hierarchy.

20 Claims, 15 Drawing Sheets

(56) References Cited

U.S. PATENT DOCUMENTS

| | | | | |
|---|---|---|---|---|
| 2011/0258514 | A1* | 10/2011 | Lasser | H03M 13/2906 714/763 |
| 2012/0300873 | A1* | 11/2012 | Graumann | H03M 13/611 375/295 |
| 2014/0129896 | A1* | 5/2014 | Parthasarathy | H03M 13/152 714/755 |
| 2017/0272102 | A1* | 9/2017 | Goldenberg | G06F 11/1012 |
| 2018/0091172 | A1* | 3/2018 | Ilani | G06F 11/1012 |
| 2019/0173495 | A1* | 6/2019 | Freudenberger | H03M 13/356 |
| 2020/0412386 | A1* | 12/2020 | Berman | G06F 11/1012 |

OTHER PUBLICATIONS

"IEEE Standard for Error Correction Coding of Flash Memory Using Low-Density Parity Check Codes," in IEEE Std 1890-2018 , vol., No., pp. 1-51, Feb. 28, 2019, doi: 10.1109/IEEESTD.2019.8654228. (Year: 2019).*

* cited by examiner

HIERARCHICAL ERROR CORRECTION CODE

BACKGROUND

The following relates generally to memory devices, and more specifically to flash memory error code correction.

Memory devices are commonly used electronic components for storing data. NAND flash memory devices allow several bits of data to be stored in each memory cell, providing improvements in manufacturing costs and performance. A memory cell in which multiple bits of data are stored may be referred to as a multi-level memory cell. A multi-level memory cell partitions a threshold voltage range of a memory cell into several voltage states, and data values written to the memory cell are extracted using the memory cell voltage levels.

In some cases, data may be encoded prior to programming to a memory device in order to provide the ability to correct for read errors. However, many decoders assume an additive white Gaussian noise (AWGN) model, but the noise introduced by Flash memory cells may not be consistent with an AWGN model. Furthermore, decoding a polar decoding scheme can be computationally intensive. For instance, VNAND devices increase a number of layers and increase bits per-cells modulation on the NAND (e.g., via vertical stacking of NAND devices). Such may cause a decrease in a NAND signal to noise ratio (SNR) and demand stronger error-correction mechanisms. Therefore, there is a need in the art for improved systems and methods for decoding information stored in a memory device.

SUMMARY

A method, apparatus, non-transitory computer readable medium, and system for hierarchical error code correction are described. Embodiments of the method, apparatus, non-transitory computer readable medium, and system are configured to read a first codeword from a first location of a memory device, perform a first decoding process on the first codeword using a first decoder, determine that the first codeword failed the first decoding process, combine the first codeword and a second codeword to form a first combined codeword based on the determination that the first codeword failed the first decoding process, and perform a second decoding process on the first combined codeword using a second decoder.

A method, apparatus, non-transitory computer readable medium, and system for hierarchical error code correction are described. Embodiments of the method, apparatus, non-transitory computer readable medium, and system are configured to receive data for storage in a memory device, generate a combined codeword based on an inner coding scheme and an outer coding scheme, wherein a first portion of the combined codeword and a second portion of the combined codeword are encoded separately using the inner coding scheme and jointly using the outer coding scheme, and store the first portion of the combined codeword at a first location of the memory device and the second portion of the combined codeword at a second location of the memory device.

An apparatus, system, and method for hierarchical error code correction are described. Embodiments of the apparatus, system, and method are configured to a memory device, a first decoder configured to perform a first decoding process on a first codeword read from the memory device, and a second decoder configured to perform a second decoding process on a first combined codeword comprising the first codeword and a second codeword read from the memory device when the first codeword fails the first decoding process.

BRIEF DESCRIPTION OF THE DRAWINGS

Features of the present inventive concept will become more apparent by describing in detail embodiments thereof with reference to the accompanying drawings.

DETAILED DESCRIPTION

Figure 1:
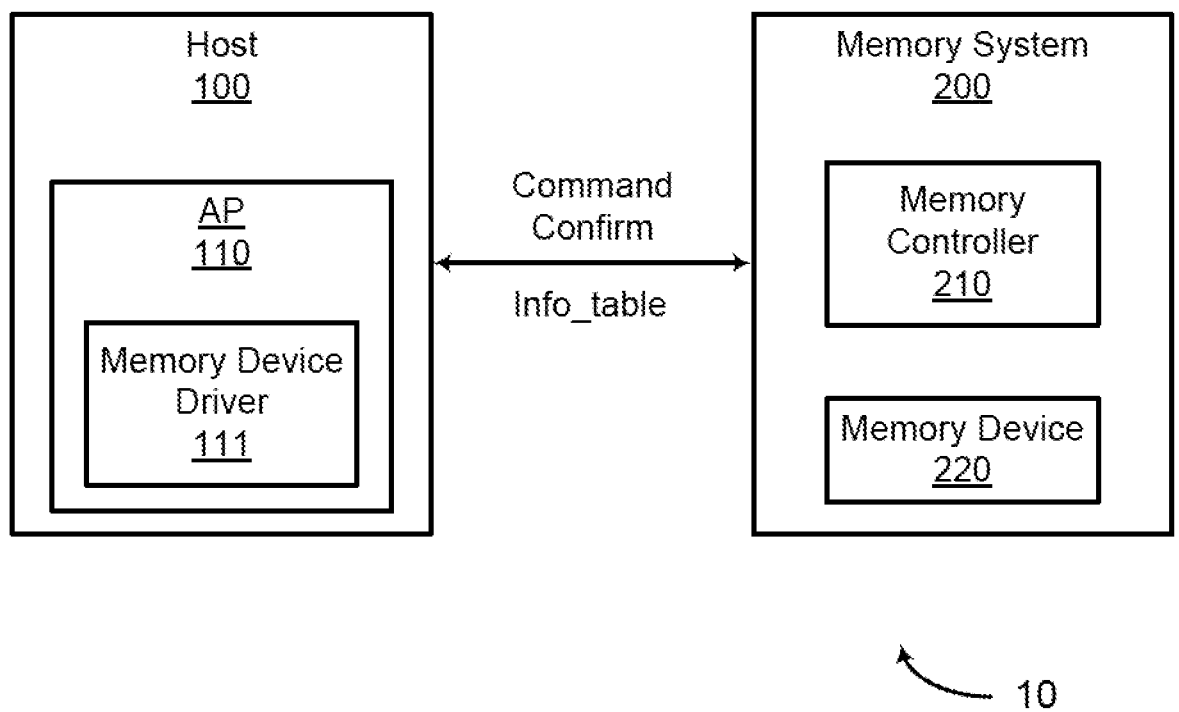
FIG. 1 is a block diagram illustrating an implementation of a data processing system including a memory system, according to an embodiment of the inventive concept.

The present disclosure describes systems and methods for error correction, and more specifically for encoding and decoding a codeword in a memory device using hierarchical coding techniques.

NAND programming is a complex process based on applying a voltage to a memory cell. However, cell voltage may be affected by variables such as current voltage level, pulse power, and inter-cell interferences. Cell voltage may also be affected by inhibited cell disruption, inter-word line (WL) coupling, and cell retention. Additionally, the outcome of writing to a NAND device is stochastic. For example, data may also be noisy, leading to problems with observation.

A decoder is a logic circuit used to convert binary information from coded inputs to unique outputs. Multiple inputs and multiple outputs may be used. Channel coding performs encoding and decoding operations on a data stream to correct communication errors such as interference or noise. Channel coding is performed on a first data stream with a first set of operations at a transmitting device and a second data stream with a second set of operations at a receiving device. Channel coding may be a block code or a convolutional code.

Polar codes are a subset of channel coding. Polar coding is a block code method, where a block of data and bits have a set size. A manipulation to the block is performed at the transmitter and receiver. Operations called Channel Combining and Channel Splitting are performed. First, Channel Combining assigns and/or maps combinations of symbols to channels. Then, Channel Splitting performs a transformation operation, translating symbol combinations into time domain vectors used in the decoder. The decoding operation, with the encoding operation, estimates time domain bit streams. This converts the block of bits and channels into a polarized bit stream at the receiver. Polar codes have been shown to achieve capacity for Additive white Gaussian noise (AWGN) channels and achieve comparable performance to Low-density parity-check code (LDPC) for finite length code using a Successive Cancelation List (SCL) decoder with cyclic redundancy checks (CRC). The SCL decoder has a high latency because each bit is decoded successively.

In solid-state drive (SSD) devices, flash memory controllers are connected to several NAND channels in parallel to achieve high data throughput. The memory controller includes signal processing and Error Correction Code (ECC) engines that decode the data from the NAND and retrieve the stored data reliably. Some hardware architectures may maximize the throughput of the memory system by applying fast reads from the NAND and fast decoding techniques. Additionally, hardware architectures may perform correction methods in, for example, data retention and data corruption. VNAND increases a number of layers and higher bits per-cells modulation on the NAND (e.g., via vertical stacking of NAND devices). Such may cause a decrease in a NAND signal to noise ratio (SNR) and demand stronger error-correction mechanisms. Some methods, such as decoding algorithms, may be used to improve correctability to increase the code word length. However, some methods reduce SSD performance (e.g., reduce input/output operations per second (TOPS)) and may use more complex hardware.

Embodiments of the present disclosure provide a controller hierarchical decoding architecture. For instance, multiple decoder hierarchies may be implemented along with use of hierarchies of codes with locality (e.g., where larger code lengths of subsequent hierarchies may be composed of local codes from a lower hierarchy). The hierarchical ECC decoding includes multiple hierarchies such as a first hierarchy, a second hierarchy, and additional hierarchies as needed. A first hierarchy may include low-complexity ECC engines, each connected to a NAND channel for computing local codes of low code lengths. A next hierarchy (e.g., a second hierarchy) may include higher complexity ECC engines that may share several NAND channels for correcting corrupt data using relatively larger code length (e.g., and the higher complexity ECC engines of the second hierarchy may perform decoding operations using more complex decoding algorithms). The larger code length may be composed of local codes from a previous hierarchy.

Additional hierarchies may be added, where each additional hierarchy may share more NAND channels. The additional hierarchies may include longer codes (composed of more local codes, such as combined local codes) and stronger decoding algorithms. Accordingly, the provided controller hierarchical decoder embodiments include different hierarchies of decoder implementations. Each hierarchy includes stronger decoding capability than the previous (e.g., lower) hierarchy. One aspect of the stronger decoding capability is longer code length, achieved with a hierarchical structure of codes with locality. Another aspect of the stronger decoding capability is using more complex decoding algorithms at each subsequent hierarchy of ECC engines. Higher hierarchies may thus implement more complex decoding algorithms and more complex EEC engine hardware. Higher hierarchies may further be used less frequently, and therefore may be slower and have less instances, where each instance serves more NAND channels.

The hierarchical code is planned such that each hierarchy achieves throughput and correctability performance. For instance, lower hierarchies may be implemented for applying fast reads from the NAND and fast decoding techniques, while higher hierarchies may be implemented less frequently, for example, for more complex decoding operations, when more powerful decoding schemes are desired, when lower hierarchy decoding schemes fail, etc. Such may enable the use of long codes and complex hardware with acceptable hardware complexity (e.g., via implementation of higher hierarchies for complex decoding operations) while maintaining performance (e.g., an IOPS threshold) of the SSD (e.g., via implementation of lower hierarchies for relatively less complex decoding operations).

Embodiments of the present inventive concept will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an embodiment may be described as a "second" element in another embodiment.

It should be understood that descriptions of features or aspects within each embodiment should typically be considered as available for other similar features or aspects in other embodiments, unless the context clearly indicates otherwise.

As used herein, the singular forms "a", "an" and "the" are intended to include the plural forms as well, unless the context clearly indicates otherwise.

Herein, when one value is described as being about equal to another value or being substantially the same as or equal to another value, it is to be understood that the values are equal to each other to within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations as understood by one of the ordinary skill in the art. Further, it is to be understood that while parameters may be described herein as having "about" a certain value, according to embodiments, the parameter may be exactly the certain value or approximately the certain value within a measurement error as would be understood by a person having ordinary skill in the art.

Example Memory Device

FIGS. 1-5 show an example memory system according to aspects of the present disclosure. In memory systems (e.g., such as SSD systems), memory controllers are connected to several NAND channels in parallel to achieve high data throughput. Memory controllers include signal processing and ECC engines that decode the data from the NAND and retrieve the stored data reliably. As described herein, the example memory system of FIGS. 1-5 may include a memory controller with a hierarchical decoding architecture (e.g., with multiple decoder hierarchies) that may be implemented along with use of hierarchies of codes with locality.

FIG. 1 is a block diagram illustrating an implementation of a data processing system including a memory system, according to an embodiment of the inventive concept.

Referring to FIG. 1, the data processing system 10 may include a host 100 and a memory system 200. The memory system 200 shown in FIG. 1 may be utilized in various systems that include a data processing function. The various systems may be various devices including, for example, mobile devices, such as a smartphone or a tablet computer. However, the various devices are not limited thereto.

The memory system 200 may include various types of memory devices. Herein, embodiments of the inventive concept will be described as including a memory device that is a non-volatile memory. However, embodiments are not limited thereto. For example, the memory system 200 may include a memory device that is a volatile memory.

According to embodiments, the memory system 200 may include a non-volatile memory device such as, for example, a read-only memory (ROM), a magnetic disk, an optical disk, a flash memory, etc. The flash memory may be a memory that stores data according to a change in a threshold voltage of a metal-oxide-semiconductor field-effect transistor (MOSFET), and may include, for example, NAND and NOR flash memories. The memory system 200 may be implemented using a memory card including a non-volatile memory device such as, for example, an embedded multimedia card (eMMC), a secure digital (SD) card, a micro SD card, or a universal flash storage (UFS), or the memory system 200 may be implemented using, for example, an SSD including a non-volatile memory device. Herein, the configuration and operation of the memory system 200 will be described assuming that the memory system 200 is a non-volatile memory system. However, the memory system 200 is not limited thereto. The host 100 may include, for example, a system-on-chip (SoC) application processor (AP) mounted on, for example, a mobile device, or a central processing unit (CPU) included in a computer system.

A processor is an intelligent hardware device (e.g., a general-purpose processing component, a digital signal processor (DSP), a CPU, a graphics processing unit (GPU), a microcontroller, an application specific integrated circuit (ASIC), a field programmable gate array (FPGA), a programmable logic device, a discrete gate or transistor logic component, a discrete hardware component, or any combination thereof). In some cases, the processor is configured to operate a memory array using a memory controller. In other cases, a memory controller is integrated into the processor. In some cases, the processor is configured to execute computer-readable instructions stored in a memory to perform various functions. In some embodiments, a processor includes special purpose components for modem processing, baseband processing, digital signal processing, or transmission processing.

As described above, the host 100 may include an AP 110. The AP 110 may include various intellectual property (IP) blocks. For example, the AP 110 may include a memory device driver 111 that controls the memory system 200. The host 100 may communicate with the memory system 200 to transmit a command related to a memory operation and receive a confirm command in response to the transmitted command. The host 100 may also communicate with the memory system 200 with regard to an information table related to the memory operation.

The memory system 200 may include, for example, a memory controller 210 and a memory device 220. The memory controller 210 may receive a command related to a memory operation from the host 100, generate an internal command and an internal clock signal using the received command, and provide the internal command and the internal clock signal to the memory device 220. The memory device 220 may store write data in a memory cell array in response to the internal command or may provide read data to the memory controller 210 in response to the internal command.

As described herein, a memory controller 210 may include a hierarchical decoding architecture. For instance, memory controller 210 may include a first hierarchy of low-complexity ECC engines (e.g., with each ECC engine connected to a NAND channel for computing local codes of low code lengths). Memory controller 210 may further include additional hierarchies of higher complexity ECC engines (e.g., a second hierarchy of ECC engines, a third hierarchy of ECC engines, etc.), where the higher complexity ECC engines may share several NAND channels for correcting corrupt data using relatively larger code length (e.g., where code lengths of each hierarchy may be composed of combined local codes from a previous hierarchy). Memory controller 210 is an example of, or includes aspects of, the corresponding element described herein (e.g., with reference to FIG. 8).

Figure 4:
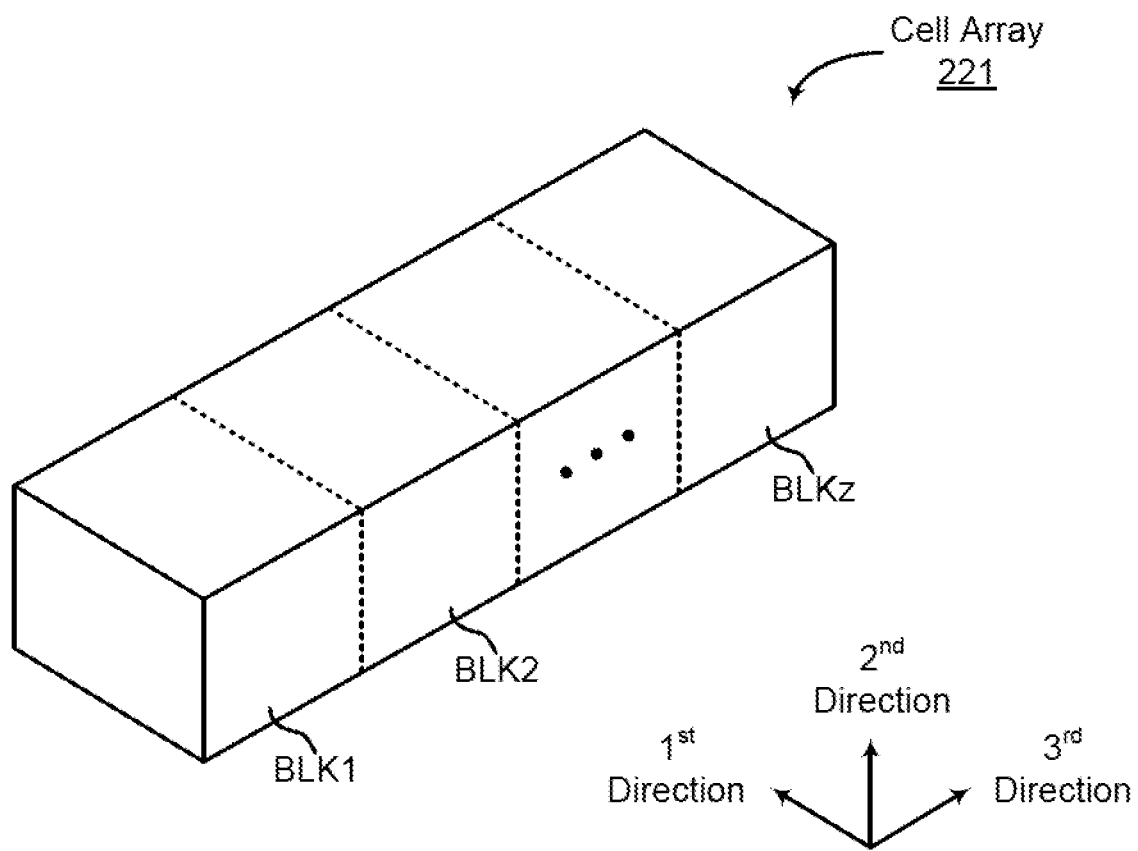
FIG. 4 is a block diagram of the memory cell array of FIG. 2, according to an embodiment of the inventive concept.

The memory device 220 includes a memory cell array that retains data stored therein, even when the memory device 220 is not powered on. The memory cell array may include as memory cells, for example, a NAND or NOR flash memory, a magneto-resistive random-access memory (MRAM), a resistive random-access memory (RRAM), a ferroelectric access-memory (FRAM), or a phase change memory (PCM). For example, when the memory cell array includes a NAND flash memory, the memory cell array may include a plurality of blocks and a plurality of pages. Data may be programmed and read in units of pages, and data may be erased in units of blocks. An example of memory blocks included in a memory cell array is shown in FIG. 4.

Figure 2:
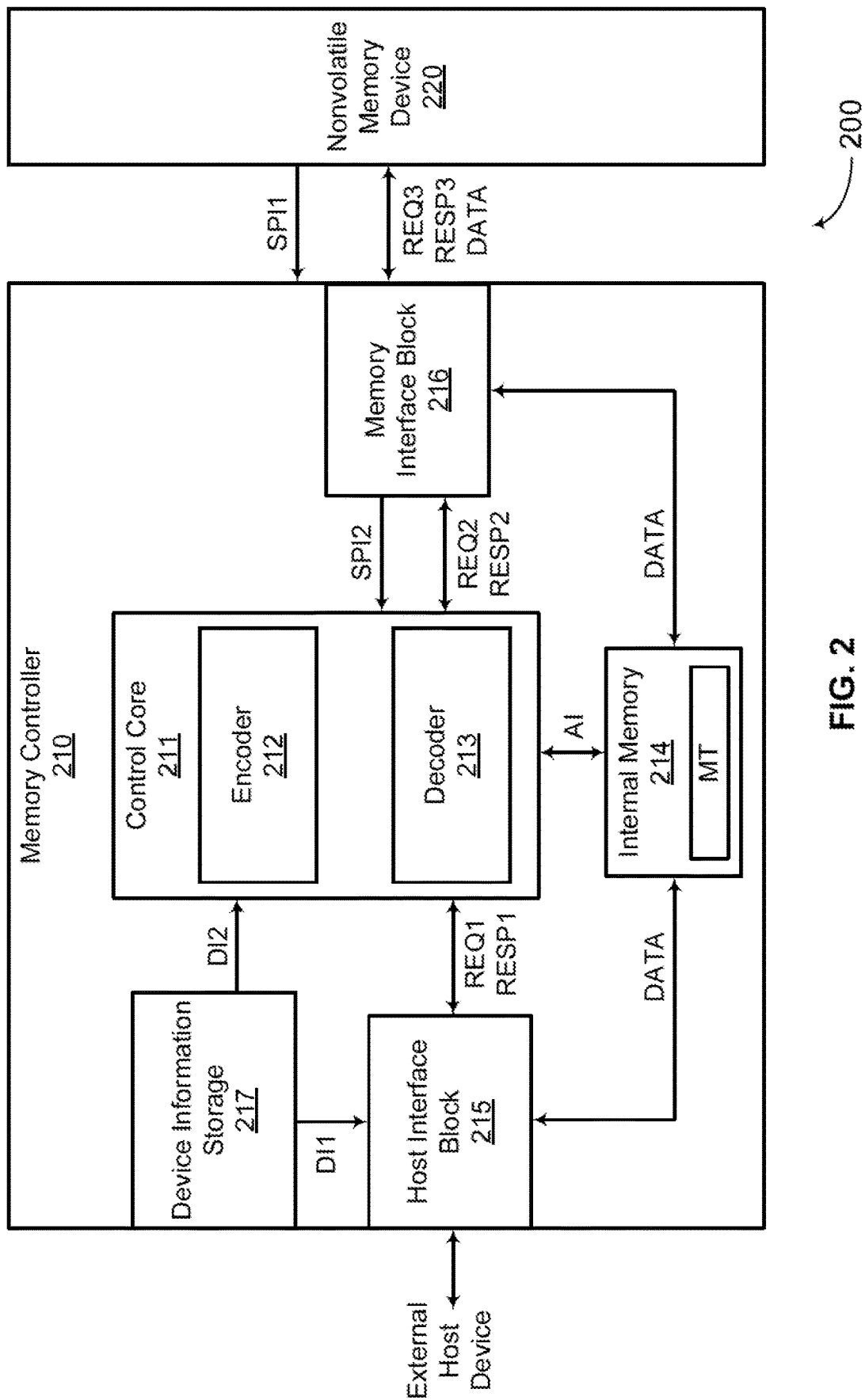
FIG. 2 is a block diagram illustrating the memory system of FIG. 1, according to an embodiment of the inventive concept.

FIG. 2 is a block diagram illustrating the memory system 200 of FIG. 1, according to an embodiment of the inventive concept.

Referring to FIG. 2, the memory system 200 includes the memory device 220 and the memory controller 210. The memory controller 210 may also be referred to herein as a controller circuit. The memory device 220 may perform a write operation, a read operation, or an erase operation under control of the memory controller 210.

The memory controller 210 may control the memory device 220 depending on a request received from the host 100 or an internally designated schedule. The memory controller 210 may include a controller core 211, an internal memory 214, a host interface block 215, and a memory interface block 216. The memory controller 210 may also include a device information storage 217 configured provide first device information DI' to the host interface block 215 and second device information DI2 to the controller core 211.

The controller core 211 may include an encoder 212 and a decoder 213. Encoder 212 is an example of, or includes aspects of, the corresponding elements described with reference to FIG. 6. Decoder 213 is an example of, or includes aspects of, the corresponding elements described with reference to FIGS. 8-10. The memory control core may control and access the memory device 220 depending on a request received from the host 100 or an internally designated schedule. The memory control core may manage and execute various metadata and codes used to manage or operate the memory system 200. In some embodiments, the controller core 211 may include a memory control core and a machine learning core, and each of these cores may be implemented by one or more processors.

In some examples, memory controller 210 may include a machine learning core. The machine learning core may be used to perform training and inference of a neural network (e.g., a neural network that is designed to perform noise cancellation on the memory device 220).

The internal memory 214 may be used, for example, as a system memory which is used by the controller core 211, a cache memory which stores data of the memory device 220, or a buffer memory which temporarily stores data between the host 100 and the memory device 220. The internal memory 214 may store a mapping table MT that indicates a relationship between logical addresses assigned to the memory system 200 and physical addresses of the memory device 220. The internal memory 214 may include, for example, a DRAM or an SRAM.

The host interface block 215 may include a component for communicating with the host 100 such as, for example, a physical block. The memory interface block 216 may include a component for communicating with the memory device 220 such as, for example, a physical block.

Below, an operation of the memory system 200 over time will be described. When power is supplied to the memory system 200, the memory system 200 may perform initialization with the host 100.

The host interface block 215 may provide the memory control core with a first request REQ1 received from the host 100. The first request REQ1 may include a command (e.g., a read command or a write command) and a logical address. The memory control core may translate the first request REQ1 to a second request REQ2 suitable for the memory device 220.

For example, the memory control core may translate a format of the command. The memory control core may obtain address information AI with reference to the mapping table MT stored in the internal memory 214. The memory control core may translate a logical address to a physical address of the memory device 220 by using the address information AI. The memory control core may provide the second request REQ2 suitable for the memory device 220 to the memory interface block 216.

The memory interface block 216 may register the second request REQ2 from the memory control core at a queue. The memory interface block 216 may transmit a request that is first registered at the queue to the memory device 220 as a third request REQ3.

When the first request REQ1 is a write request, the host interface block 215 may write data received from the host 100 to the internal memory 214. When the third request REQ3 is a write request, the memory interface block 216 may transmit data stored in the internal memory 214 to the memory device 220.

When data is completely written, the memory device 220 may transmit a third response RESP3 to the memory interface block 216. In response to the third response RESP3, the memory interface block 216 may provide the memory control core with a second response RESP2, indicating that the data is completely written.

After the data is stored in the internal memory 214 or after the second response RESP2 is received, the memory control core may transmit a first response RESP1 indicating that the request is completed to the host 100 through the host interface block 215.

When the first request REQ1 is a read request, the read request may be transmitted to the memory device 220 through the second request REQ2 and the third request REQ3. The memory interface block 216 may store data received from the memory device 220 in the internal memory 214. When data is completely transmitted, the memory device 220 may transmit the third response RESP3 to the memory interface block 216.

As the third response RESP3 is received, the memory interface block 216 may provide the memory control core with the second response RESP2 indicating that the data is completely stored. As the second response RESP2 is received, the memory control core may transmit the first response RESP1 to the host 100 through the host interface block 215.

The host interface block 215 may transmit data stored in the internal memory 214 to the host 100. In an embodiment, in the case in which data corresponding to the first request REQ1 is stored in the internal memory 214, the transmission of the second request REQ2 and the third request REQ3 may be omitted.

The memory device 220 may also transmit first Serial Peripheral Interface information SPI1 to the memory interface block 216. The memory interface block 216 may transmit second Serial Peripheral Interface information SPI2 to the controller core 211.

Figure 3:
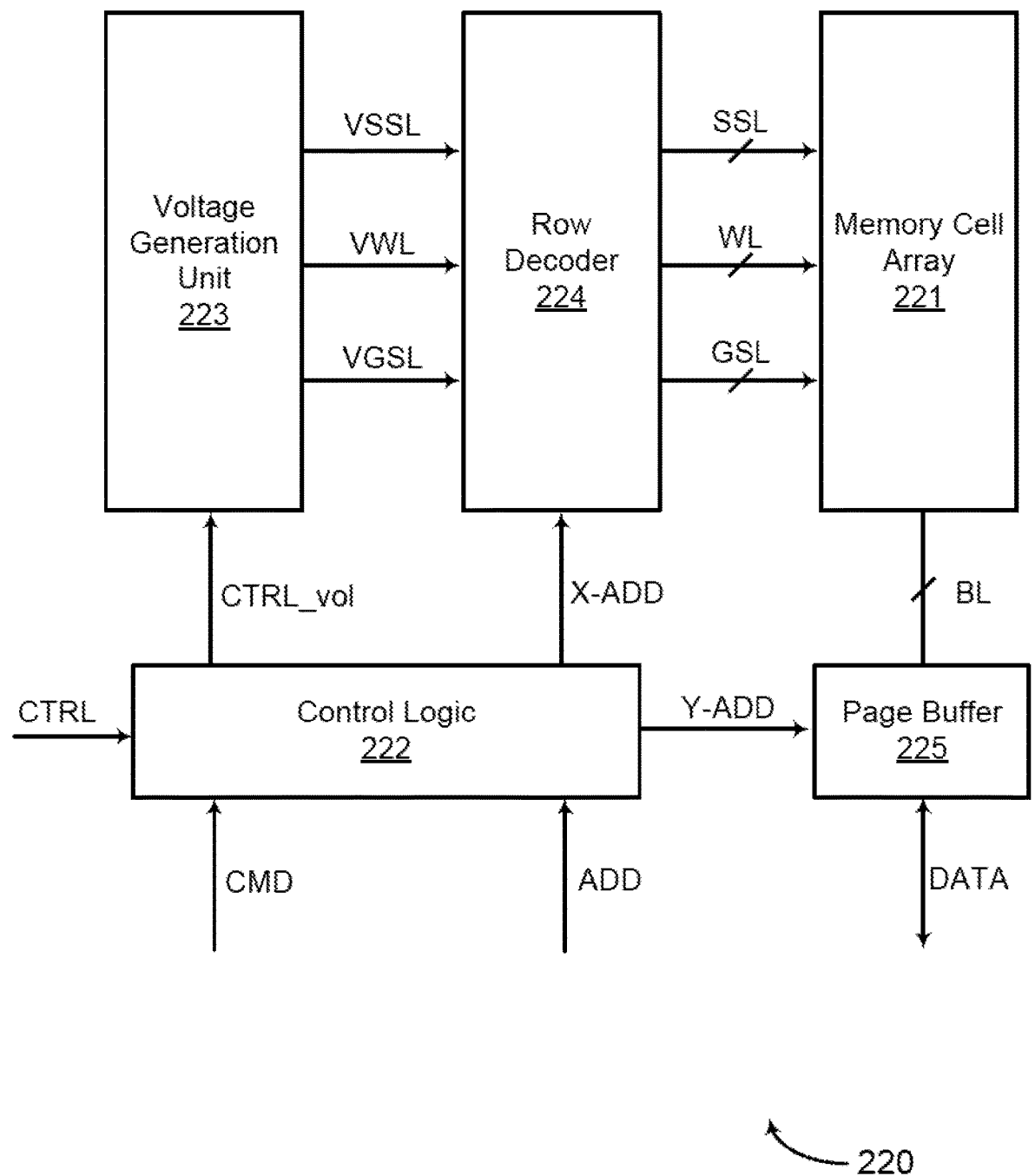
FIG. 3 is a detailed block diagram of a non-volatile memory device of FIG. 1, according to an embodiment of the inventive concept.

FIG. 3 is a detailed block diagram of the non-volatile memory device 220 of FIG. 1, according to an embodiment of the inventive concept. Referring to FIG. 3, the memory device 220 may include, for example, a memory cell array 221, a control logic 222, a voltage generation unit 223, a row decoder 224, and a page buffer 225.

The memory cell array 221 may be connected to one or more string select lines SSL, a plurality of word lines WL, one or more ground select lines GSL, and a plurality of bit lines BL. The memory cell array 221 may include a plurality of memory cells disposed at intersections between the plurality of word lines WL and the plurality of bit lines BL.

The control logic 222 may receive a command CMD (e.g., an internal command) and an address ADD from the memory controller 210 and receive a control signal CTRL for controlling various functional blocks within the memory device 220 from the memory controller 210. The control logic 222 may output various control signals for writing data to the memory cell array 221 or reading data from the memory cell array 221, based on the command CMD, the address ADD, and the control signal CTRL. In this manner, the control logic 222 may control the overall operation of the memory device 220.

The various control signals output by the control logic 222 may be provided to the voltage generation unit 223, the row decoder 224, and the page buffer 225. For example, the control logic 222 may provide the voltage generation unit 223 with a voltage control signal CTRL_vol, provide the row decoder 224 with a row address X-ADD, and provide the page buffer 225 with a column address Y-ADD.

The voltage generation unit 223 may generate various voltages for performing program, read, and erase operations on the memory cell array 221 based on the voltage control signal CTRL_vol. For example, the voltage generation unit 223 may generate a first driving voltage VWL for driving the plurality of word lines WL, a second driving voltage VSSL for driving the plurality of string select lines SSL, and a third driving voltage VGSL for driving the plurality of ground select lines GSL. In this case, the first driving voltage VWL may be a program voltage (e.g., a write voltage), a read voltage, an erase voltage, a pass voltage, or a program verify voltage. In addition, the second driving voltage VSSL may be a string select voltage (e.g., an on voltage or an off voltage). Further, the third driving voltage VGSL may be a ground select voltage (e.g., an on voltage or an off voltage).

The row decoder 224 may be connected to the memory cell array 221 through the plurality of word lines WL, and may activate a part of the plurality of word lines WL in response to the row address X-ADD received from the control logic 222. For example, in a read operation, the row decoder 224 may apply a read voltage to a selected word line and a pass voltage to unselected word lines.

In a program operation, the row decoder 224 may apply a program voltage to a selected word line and a pass voltage to unselected word lines. In an embodiment, in at least one of a plurality of program loops, the row decoder 224 may apply the program voltage to the selected word line and an additionally selected word line.

The page buffer 225 may be connected to the memory cell array 221 through the plurality of bit lines BL. For example, in a read operation, the page buffer 225 may operate as a sense amplifier that outputs data stored in the memory cell array 221. Alternatively, in a program operation, the page buffer 225 may operate as a write driver that writes desired data to the memory cell array 221.

Figure 5:
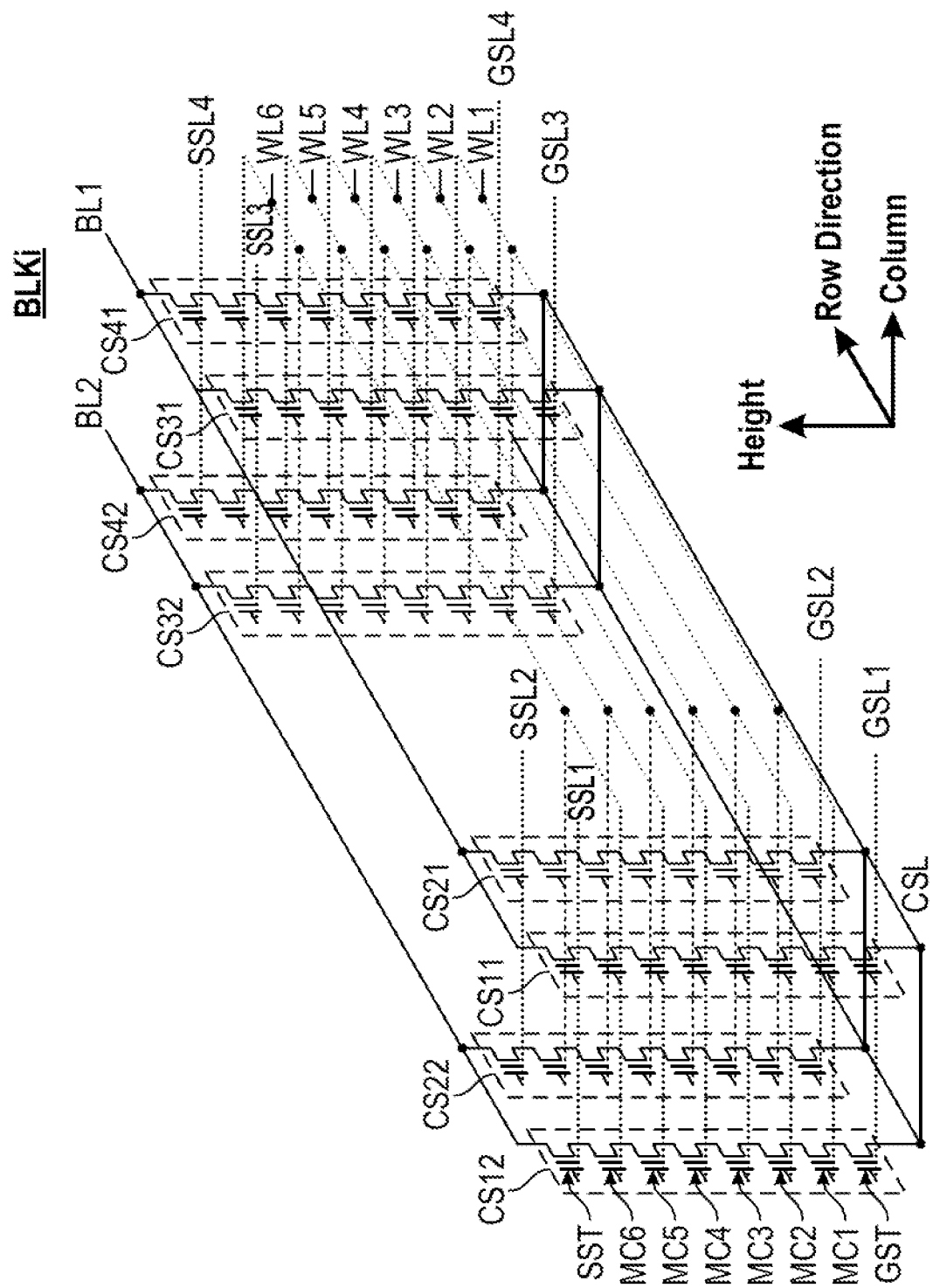
FIG. 5 is a circuit diagram of a memory block of the memory cell array of FIG. 4, according to an embodiment of the inventive concept.

FIGS. 4 and 5 illustrate an example in which the memory system 200 is implemented using a three-dimensional flash memory. The three-dimensional flash memory may include three-dimensional (e.g., vertical) NAND (e.g., VNAND) memory cells. An implementation of the memory cell array 221 including three-dimensional memory cells is described below. Each of the memory cells described below may be a NAND memory cell.

FIG. 4 is a block diagram of the memory cell array 221 of FIG. 2, according to an embodiment of the inventive concept.

Referring to FIG. 4, the memory cell array 221, according to an embodiment, includes a plurality of memory blocks BLK1 to BLKz. Each of the memory blocks BLK1 to BLKz has a three-dimensional structure (e.g., a vertical structure). For example, each of the memory blocks BLK1 to BLKz may include structures extending in first to third directions. For example, each of the memory blocks BLK1 to BLKz may include a plurality of NAND strings extending in the second direction. The plurality of NAND strings may be provided, for example, in the first to third directions.

Each of the NAND strings is connected to a bit line BL, a string select line SSL, a ground select line GSL, word lines WL, and a common source line CSL. That is, each of the memory blocks BLK1 to BLKz may be connected to a plurality of bit lines BL, a plurality of string select lines SSL, a plurality of ground select lines GSL, a plurality of word lines WL, and a common source line CSL. The memory blocks BLK1 to BLKz will be described in further detail below with reference to FIG. 5.

FIG. 5 is a circuit diagram of a memory block BLKi according to an embodiment of the inventive concept. FIG. 5 illustrates an example of one of the memory blocks BLK1 to BLKz in the memory cell array 221 of FIG. 4. Although FIG. 5 illustrates an example with 6 word lines and memory cells, this is just an illustration and any number of word lines and memory cells may be used.

The memory block BLKi may include a plurality of cell strings CS11 to CS41 and CS12 to CS42. The plurality of cell strings CS11 to CS41 and CS12 to CS42 may be arranged in column and row directions to form columns and rows. Each of the cell strings CS11 to CS41 and CS12 to CS42 may include a ground select transistor GST, memory cells MC1 to MC6, and a string select transistor SST. The ground select transistor GST, the memory cells MC1 to MC6, and the string select transistor SST, which are included in each of the cell strings CS11 to CS41 and CS12 to CS42, may be stacked in a height direction substantially perpendicular to a substrate.

The columns of the plurality of cell strings CS11 to CS41 and CS12 to CS42 may be connected to different string select lines SSL1 to SSL4, respectively. For example, the string select transistors SST of the cell strings CS11 and CS12 may be commonly connected to the string select line SSL1. The string select transistors SST of the cell strings CS21 and CS22 may be commonly connected to the string select line SSL2. The string select transistors SST of the cell strings CS31 and CS32 may be commonly connected to the string select line SSL3. The string select transistors SST of the cell strings CS41 and CS42 may be commonly connected to the string select line SSL4.

The rows of the plurality of cell strings CS11 to CS41 and CS12 to CS42 may be connected to different bit lines BL1 and BL2, respectively. For example, the string select transistors SST of the cell strings CS11 to CS41 may be commonly connected to the bit line BL1. The string select transistors SST of the cell strings CS12 to CS42 may be commonly connected to the bit line BL2.

The columns of the plurality of cell strings CS11 to CS41 and CS12 to CS42 may be connected to different ground select lines GSL1 to GSL4, respectively. For example, the ground select transistors GST of the cell strings CS11 and CS12 may be commonly connected to the ground select line GSL1. The ground select transistors GST of the cell strings CS21 and CS22 may be commonly connected to the ground select line GSL2. The ground select transistors GST of the cell strings CS31 and CS32 may be commonly connected to the ground select line GSL3. The ground select transistors GST of the cell strings CS41 and CS42 may be commonly connected to the ground select line GSL4.

The memory cells disposed at the same height from the substrate (or the ground select transistors GST) may be commonly connected to a single word line, and the memory cells disposed at different heights from the substrate may be connected to different word lines WL1 to WL6, respectively. For example, the memory cells MC1 may be commonly connected to the word line WL1. The memory cells MC2 may be commonly connected to the word line WL2. The memory cells MC3 may be commonly connected to the word line WL3. The memory cells MC4 may be commonly connected to the word line WL4. The memory cells MC5 may be commonly connected to the word line WL5. The memory cells MC6 may be commonly connected to the word line WL6. The ground select transistors GST of the cell strings CS11 to CS41 and CS12 to CS42 may be commonly connected to the common source line CSL.

Error Correction Coding

Figure 6:
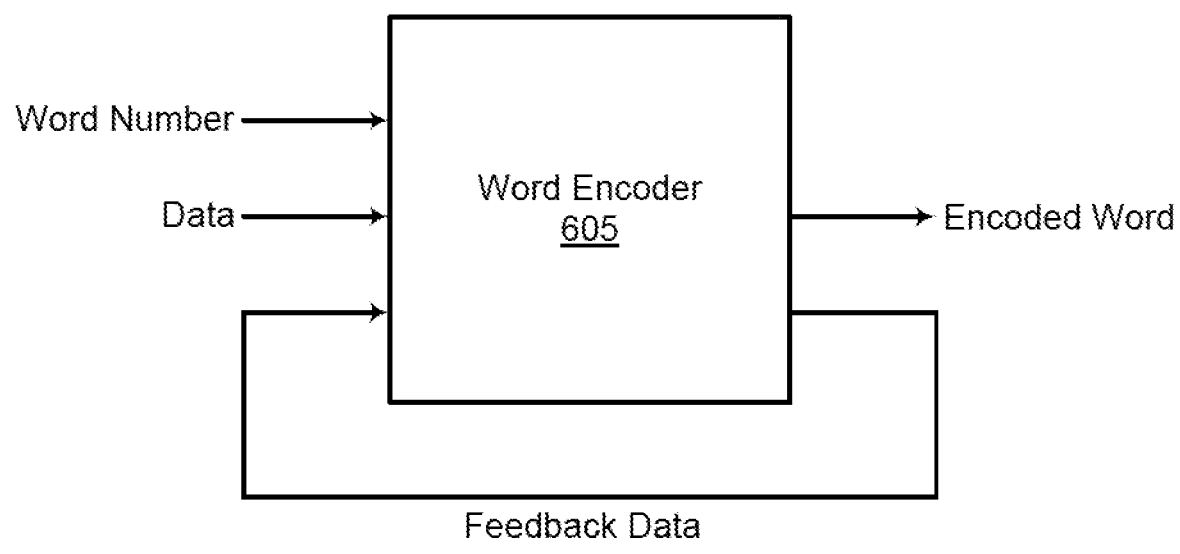
FIG. 6 shows and example of an encoder according to an embodiment of the inventive concept.
Figure 7:
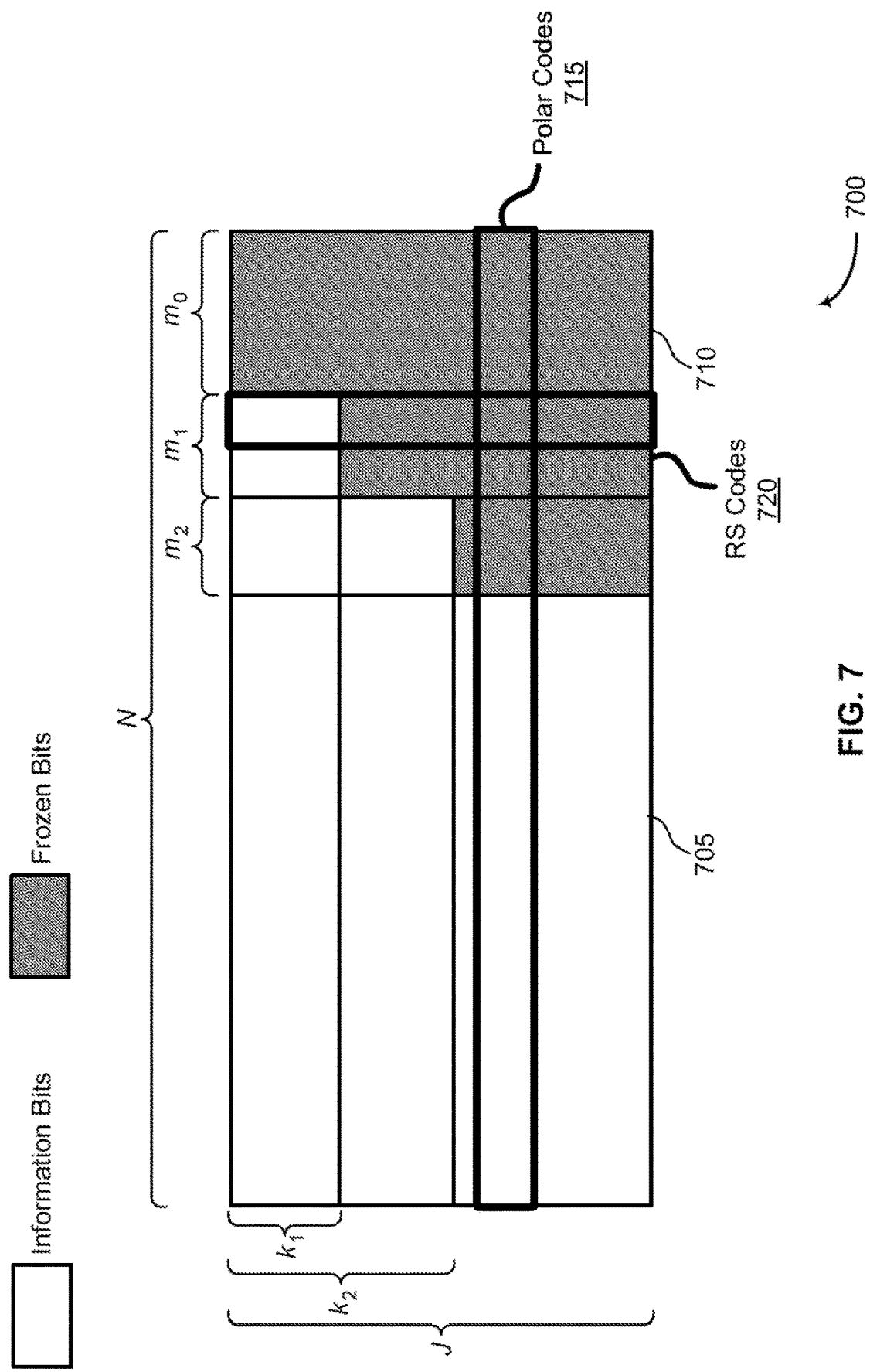
FIG. 7 shows an example of an example of an error correction code (ECC) coding scheme according to aspects of the present disclosure.
Figure 8:
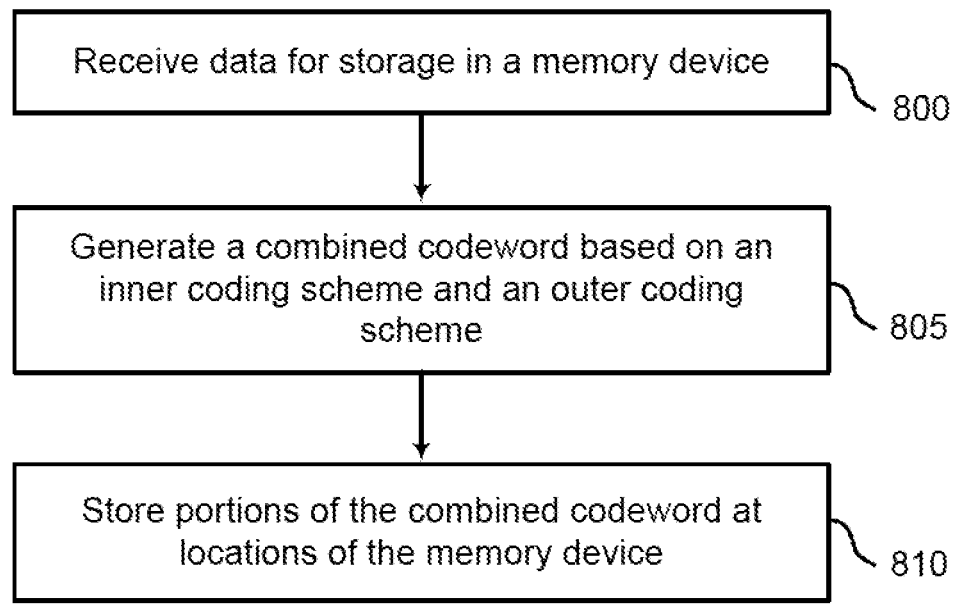
FIG. 8 shows an example of a process for hierarchical error code correction according to aspects of the present disclosure

FIGS. 6-8 show example error correction coding (e.g., ECC schemes) that may be implemented according to aspects of the techniques described herein. As described, memory systems may include memory controllers, where the memory controllers may include signal processing and ECC engines that decode data from NAND channels to reliably retrieve data stored by the memory system.

FIG. 6 shows an example of an encoding scheme 600 according to aspects of the present disclosure. An encoding scheme 600 may be implementable by an encoder 605 to encode data for programming to a memory device. ECC and decoding operations may be performed on a data stream to correct communication errors such as interference or noise. For instance, an S-Polar coding scheme may be used to encode data for programming to a memory device. The S-Polar coding scheme may incorporate aspects of Reed Solomon (RS) coding scheme and a polar coding scheme.

In some embodiments, encoding scheme 600 may implement (e.g., model the encoder 605 as) Generalized Concatenated codes (GCCs). GCCs are based on a set of outer codes and a set of nested inner codes. In such cases, encoding scheme 600 may include encoding data with outer codes to obtain codewords, where a linear binary code may then be generated based on encoding the obtained codeword using the set of nested inner codes. For GCC with polar code, the feedback data includes the frozen bits or the RS polynomial evaluations.

In some embodiments, encoding scheme 600 may implement (e.g., model the encoder 605 as) Generalized Tensor Product (GTP) codes or generalized trellis codes (GTCs). GTP codes may refer to a class of binary ECCs that are constructed by combining codes on extension fields with shorter binary codes. For the implementation of GTCs, a state diagram of encoding scheme 600 resembles a trellis lattice. Implementation of Bose-Chaudhuri-Hocquenghem (BCH) provides more precise control over the number of symbol errors correctable by the code. For instance, binary BCH codes may be designed to correct multiple bit errors. For GTC with BCH code, the feedback data includes the delta-syndrome bits or the RS polynomial evaluations.

In some examples, encoder 605 may include or refer to first encoder, a second encoder, and a third encoder. In some embodiments, as described herein, a first encoder configured to encode first data and second data separately, a second encoder configured to encode the first data and the second data together, a third encoder configured to encode the first and second data together with third data and fourth data, where the third data and the fourth data are encoded by the first encoder separately, and where the third data and the fourth data are encoded by the second encoder together.

FIG. 7 shows an example of an ECC encoding scheme according to aspects of the present disclosure. An S-Polar coding scheme may be used to encode data for programming to a memory device. The S-Polar coding scheme may incorporate aspects of RS coding scheme and a polar coding scheme. Specifically, a data block 700 is shown which includes information bits 705, frozen bits 710 (e.g., based on the polar coding scheme), polar codewords 715, and RS codewords 720.

As described herein, ECC and decoding operations may be performed on a data stream to correct communication errors such as interference or noise. A polar code is a linear block error-correcting code based on a multiple recursive concatenation of a short kernel code that transforms the physical channel into multiple virtual outer channels. The virtual channels tend to either have high reliability or low reliability (i.e., they polarize). Data bits are allocated to the most reliable channels, and unreliable channels are "frozen" or set to 0.

RS codes also operate on a block of data, which is treated as a set of finite field elements called symbols. An RS encoding scheme involves adding check symbols to the data. Using the check symbols, an RS code can detect erroneous symbols.

An S-Polar code is based on a polar code and RS code concatenation. Features of the S-Polar code include high performance and easy scalability with overheads and code sizing. S-Polar codes may use a multi-stage encoding process. Multiple RS codes may be encoded in parallel, symbol by symbol.

Polar coding is a form of channel coding based on a block code method. In polar coding, each block of data to be encoded has a set number of bits. A manipulation to the block is performed at the transmitter and receiver. For example, Channel Combining and Channel Splitting are performed on each block of data. First, Channel Combining assigns and/or maps combinations of symbols to channels. Then, Channel Splitting performs a transformation operation, translating symbol combinations into time domain vectors used in the decoder. The decoding operation, with the encoding operation, estimates time domain bit streams. This converts the block of bits and channels into a polarized bit stream at the receiver. Polar codes have been shown to achieve capacity for Additive white Gaussian noise (AWGN) channels and achieve comparable performance to Low-density parity-check code (LDPC) for finite length code using a Successive Cancelation List (SCL) decoder with cyclic redundancy checks (CRC). The SCL decoder has a high latency because each bit is decoded successively. A Neural Network (NN) decoder can be used in Polar codes. In some examples, a neural network decoder in place of an SCL decoder (e.g., for relatively short codes). The decoding of the neural network decoder may be performed with very low latency, because all the bits may be decoded in parallel.

FIG. 8 shows an example of a process for hierarchical error code correction according to aspects of the present disclosure. In some examples, these operations are performed by a system including a processor executing a set of codes to control functional elements of an apparatus. Additionally or alternatively, certain processes are performed using special-purpose hardware. Generally, these operations are performed according to the methods and processes described in accordance with aspects of the present disclosure. In some cases, the operations described herein are composed of various substeps, or are performed in conjunction with other operations.

At operation 800, the system receives data for storage in a memory device. In some cases, the operations of this step refer to, or may be performed by, a memory controller as described with reference to FIGS. 1, 2, and 9.

At operation 805, the system generates a combined codeword based on an inner coding scheme and an outer coding scheme, where a first portion of the combined codeword and a second portion of the combined codeword are encoded separately using the inner coding scheme and jointly using the outer coding scheme. In some cases, the operations of this step refer to, or may be performed by, a memory controller as described with reference to FIGS. 1, 2, and 9.

At operation 810, the system stores the first portion of the combined codeword at a first location of the memory device and the second portion of the combined codeword at a second location of the memory device. In some cases, the operations of this step refer to, or may be performed by, a memory system as described with reference to FIG. 9.

Hierarchical Decoding Scheme

FIGS. 9-12 show example hierarchical decoding schemes that may be implemented according to aspects of the present disclosure. As described, memory systems may include memory controllers, where the memory controllers may include signal processing and ECC engines that decode data from NAND channels to reliably retrieve data stored by the memory system. According to the techniques described herein, such memory controllers may be implemented according to a hierarchical decoding architecture. For instance, multiple decoder hierarchies may be implemented along with use of hierarchies of codes with locality (e.g., where larger code lengths of subsequent hierarchies may be composed of local codes from a lower hierarchy). For instance, a hierarchical decoding scheme (e.g., a hierarchal ECC decoding scheme) may include multiple hierarchies such as a first hierarchy, a second hierarchy, and a third hierarchy (e.g., as described below, with reference to FIGS. 9-12).

Figure 9:
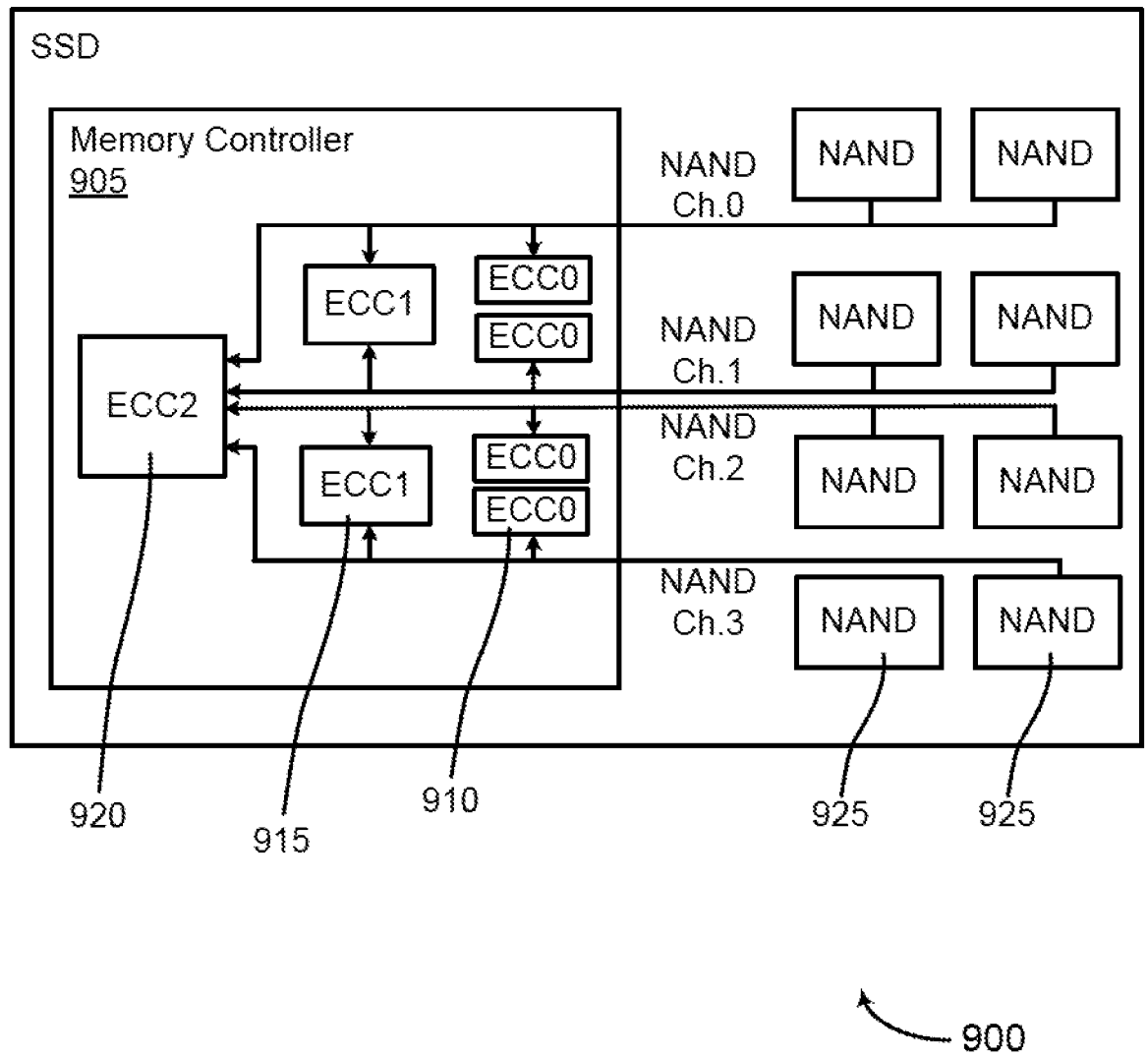
FIG. 9 shows an example of a memory system according to aspects of the present disclosure.

FIG. 9 shows an example of a memory system 900 according to aspects of the present disclosure. Memory system 900 is an example of, or includes aspects of, the corresponding element described with reference to FIG. 9. In one embodiment, memory system 900 includes memory controller 905, first decoders 910 (e.g., ECC0$s$), second decoders 915 (e.g., ECC1$s$), third decoder 920 (e.g., ECC2), and NAND cells 925. In some cases, first decoders 910, second decoders 915, and third decoder 920 may be respectfully be referred to as first ECC engines, second ECC engines, and third ECC engines.

Memory controller 905 may include a hierarchical decoding architecture. For instance, memory controller 905 may include a first hierarchy of first decoders 910 (e.g., when in some cases may be referred to herein as low-complexity ECC engines). Each first decoder 910 may be connected to a NAND channel for computing local codes of low code lengths (e.g., codes of a corresponding first, or lowest, hierarchy). Memory controller 905 may further include additional hierarchies. In the example of FIG. 9, memory controller 905 further includes a second hierarchy of second decoders 915 and a third hierarchy of a third decoder 920. Second decoders 915 may share several NAND channels for correcting corrupt data using relatively larger code length (e.g., where code lengths of each hierarchy may be composed of combined local codes from a previous hierarchy). For instance, a second decoder 915 may share NAND Ch.0 and NAND Ch.1, while another second decoder 915 may share NAND Ch.2 and NAND Ch.3. Moreover, a third decoder 920 may share several NAND channels for correcting corrupt data using relatively larger code length. For instance, third decoder 920 may share NAND Ch.0, NAND Ch.1, NAND Ch.2, and NAND Ch.3.

The controller hierarchical decoder (e.g., the architecture of memory controller 905) includes different hierarchies of decoder implementation. Each hierarchy includes stronger decoding capability than the previous hierarchy. One aspect of the stronger decoding capability is longer code length, achieved with a structure of codes with locality. Another aspect of the stronger decoding capability is using more complex decoding algorithms. High hierarchy have more complex decoding algorithm and hardware but are used less frequently, and therefore may be slower and have less instances, where each instance serves more NAND channels.

In an example scenario of a code structure with locality (e.g., and as further described with reference to FIG. 9), FIG. 9 shows a controller with 4 NAND channels being used. In some embodiments, S-Polar code may be used in a GCC with polar codes as inner codes and RS as outer codes. In the example of FIG. 9, there may be three hierarchies of locality (e.g., 4 KB, 16 KB, and 64 KB). Each of the first hierarchy, the second hierarchy, and the third hierarchy are further described herein, for example, with reference to FIGS. 10-12. As described herein, the correctability improves with the hierarchy. The decoding latency increases with the hierarchy, but the total IOPS is not affected because each hierarchy has a lower probability of being used. The silicon area may increase with the hierarchy, but the number of instances may decrease with the hierarchy, so the total silicon area may not necessarily be increased.

FIGS. 9, 10, and 13-15 are shown as an example and is not intended to be limiting in terms of scope of the present disclosure. Aspects of the example hierarchal decoder architectures described herein may be modified by analogy, without departing from the scope of the present disclosure. The exact architecture may be selected depending on the controller settings. The number of hierarchies, the decoder operation modes, and complexity may depend on the controller target and may be different for mobile controllers, Client-SSD controllers, Data-Center controllers, etc. The architecture parameters trade-offs may be selected for low or high cost controllers. Additionally, the architecture parameters may be selected for current and future controllers.

In an example scenario, embodiments of the present disclosure may write full SSD/UFS, then read sector data in QD1 from a target SSD/UFS. Data may be checked such that the controller outputs to the NAND using the channel bus. In some embodiments, the number of errors read from the NAND (P/E cycles, retention, injection from outside) may be increased. In some embodiments, locality-based decoding may be used if a larger portion of data from the same word line is read when accessing the controller. In some embodiments, power consumption of a controller may be measured, and if power is constant or the power is increased or decreased in approximate integer (e.g., x1, x2, x3) frame decoding may be inside the GCC (due to a duplication of the same inner code decoder).

Examples of a memory system 900 include random access memory (RAM), read-only memory (ROM), or a hard disk. Examples of memory systems 900 include solid state memory and a hard disk drive. In some examples, memory is used to store computer-readable, computer-executable software including instructions that, when executed, cause a processor to perform various functions described herein. In some cases, the memory contains, among other things, a basic input/output system (BIOS) which controls basic hardware or software operation such as the interaction with peripheral components or devices. In some cases, a memory controller 905 operates memory cells. For example, the memory controller 905 can include a row decoder, column decoder, or both. In some cases, memory cells within a memory store information in the form of a logical state.

In some embodiments, examples of a memory system 900 include flash memory. Flash memory is an electronic (solid-state) non-volatile computer storage medium that can be electrically erased and reprogrammed. The two main types of flash memory are named after the NAND and NOR logic gates. The individual flash memory cells exhibit internal characteristics similar to those of the corresponding gates. Where EPROMs had to be completely erased before being rewritten, NAND-type flash memory may be written and read in blocks (or pages) which are generally much smaller than the entire device. NOR-type flash allows a single machine word (byte) to be written—to an erased location— or read independently. The NAND type operates primarily in memory cards, USB flash drives, solid-state drives (those produced in 2009 or later), and similar products, for general storage and transfer of data. NAND or NOR flash memory is also often used to store configuration data in numerous digital products, a task previously made possible by EEPROM or battery-powered static RAM. One key disadvantage of flash memory is that it can only endure a relatively small number of write cycles in a specific block. Example applications of both types of flash memory include personal computers, PDAs, digital audio players, digital cameras, mobile phones, synthesizers, video games, scientific instrumentation, industrial robotics, and medical electronics.

In addition to being non-volatile, flash memory offers fast read access times, although not as fast as static RAM or ROM. Its mechanical shock resistance helps explain its popularity over hard disks in portable devices, as does its high durability, ability to withstand high pressure, temperature and immersion in water, etc. Although flash memory is technically a type of EEPROM, the term "EEPROM" is generally used to refer specifically to non-flash EEPROM which is erasable in small blocks, typically bytes. Because erase cycles are slow, the large block sizes used in flash memory erasing give it a significant speed advantage over non-flash EEPROM when writing large amounts of data. Flash memory costs much less than byte-programmable EEPROM and had become the dominant memory type wherever a system required a significant amount of non-volatile solid-state storage. Flash memory stores information in an array of memory cells made from floating-gate transistors. In single-level cell (SLC) devices, each cell stores only one bit of information. In multi-level cell (MLC) devices, including triple-level cell (TLC) devices, can store more than one bit per cell. The floating gate may be conductive or non-conductive.

In NOR flash, each cell has one end connected directly to ground, and the other end connected directly to a bit line. This arrangement is called "NOR flash" because it acts like a NOR gate: when one of the word lines is brought high, the corresponding storage transistor acts to pull the output bit line low. NAND flash also uses floating-gate transistors, but they are connected in a way that resembles a NAND gate: several transistors are connected in series, and the bit line is pulled low only if all the word lines are pulled high. These groups are then connected via some additional transistors to a NOR-style bit line array in the same way that single transistors are linked in NOR flash. Compared to NOR flash, replacing single transistors with serial-linked groups adds an extra level of addressing.

According to some embodiments, memory system 900 determines that the first codeword failed the first decoding process. In some examples, memory system 900 combines the first codeword and a second codeword to form a first combined codeword based on the determination that the first codeword failed the first decoding process. In some examples, memory system 900 determines that the first combined codeword failed the second decoding process. In some examples, memory system 900 combines a third codeword and a fourth codeword to form a second combined codeword. In some examples, memory system 900 combines the first combined codeword and the second combined codeword to form a third combined codeword. In some examples, the first codeword and the second codeword are read from a same word line of the memory device. In some examples, the first codeword and the second codeword are read from a same page of the memory device. In some examples, memory system 900 combines the first codeword and the second codeword with a third codeword and a fourth codeword to form the first combined codeword.

According to some embodiments, memory system 900 stores the first portion of the combined codeword at a first location of the memory device and the second portion of the combined codeword at a second location of the memory device. In some examples, the first location and the second location correspond to different bit lines within a same logical page of the memory device. In some examples, the memory device is a NAND memory device.

According to some embodiments, memory controller 905 receives data for storage in a memory device. In some examples, memory controller 905 generates a combined codeword based on an inner coding scheme and an outer coding scheme, where a first portion of the combined codeword and a second portion of the combined codeword are encoded separately using the inner coding scheme and jointly using the outer coding scheme. In some examples, the inner coding scheme includes a polar coding scheme. In some examples, the outer coding scheme includes a RS coding scheme. In some examples, the combined codeword is generated based on feedback including frozen bits. In some examples, the inner coding scheme includes a BCH coding scheme. In some examples, the outer coding scheme includes a RS coding scheme. In some examples, the combined codeword is generated based on feedback including delta syndrome bits.

According to some embodiments, first decoder 910 reads a first codeword from a first location of a memory device. In some examples, first decoder 910 performs a first decoding process on the first codeword using a first decoder 910. In some examples, the first decoding algorithm is based on a GCC including an inner polar code and an outer RS code. In some examples, the first decoding algorithm is based on a GTP including an inner BCH code and an outer RS code.

According to some embodiments, first decoder 910 may be configured to perform a first decoding process on a first codeword read from the memory device. First decoder 910 is an example of, or includes aspects of, the corresponding element described with reference to FIGS. 9 and 13.

According to some embodiments, second decoder 915 performs a second decoding process on the first combined codeword using a second decoder 915. In some examples, the first decoding process is performed based on a first algorithm, and the second decoding process is performed based on a second algorithm having a high complexity than the first algorithm. In some examples, the first codeword includes first error correction bits for the first decoding process and second error correction bits for the second decoding process. In some examples, the second codeword includes third error correction bits for the second decoding process.

According to some embodiments, second decoder 915 may be configured to perform a second decoding process on a first combined codeword comprising the first codeword and a second codeword read from the memory device when the first codeword fails the first decoding process. Second decoder 915 is an example of, or includes aspects of, the corresponding element described with reference to FIGS. 10 and 14.

According to some embodiments, third decoder 920 performs a third decoding process on the third combined codeword. According to some embodiments, third decoder 920 may be configured to perform a third decoding process on a third combined codeword comprising the first combined codeword and a second combined codeword when the first combined codeword fails the second decoding process, wherein the second combined codeword comprises a third codeword and a fourth codeword read from the memory device. Third decoder 920 is an example of, or includes aspects of, the corresponding element described with reference to FIGS. 10 and 15.

Figure 10:
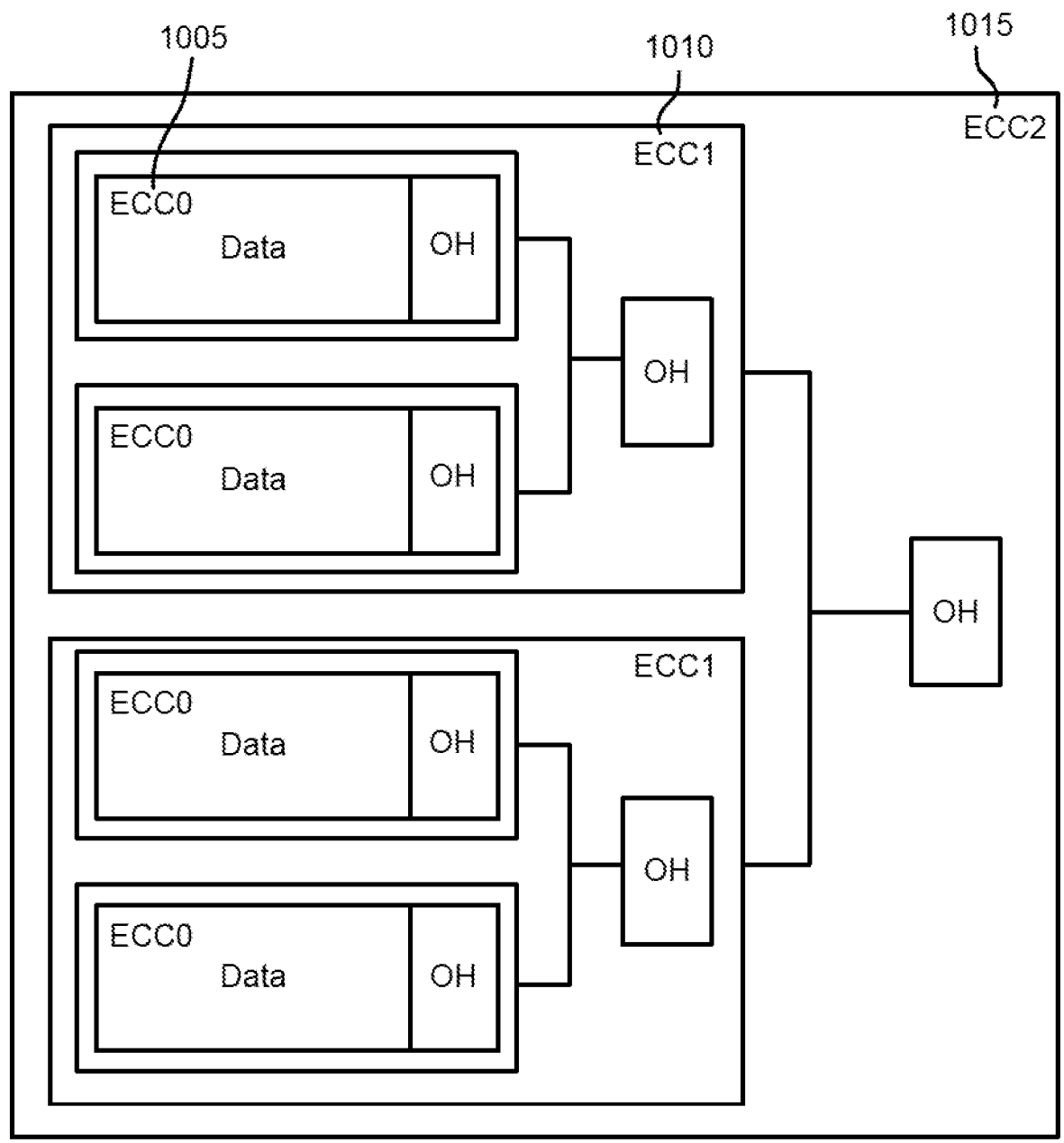
FIG. 10 shows an example of a decoder according to aspects of the present disclosure

FIG. 10 shows an example of a decoder 1000 according to aspects of the present disclosure. Decoder 1000 is an example of, or includes aspects of, the corresponding element described with reference to FIG. 2. In one embodiment, decoder 1000 includes first decoder 1005, second decoder 1010, and third decoder 1015. First decoder 1005 is an example of, or includes aspects of, the corresponding element described with reference to FIGS. 9 and 13. Second decoder 1010 is an example of, or includes aspects of, the corresponding element described with reference to FIGS. 9 and 14. Third decoder 1015 is an example of, or includes aspects of, the corresponding element described with reference to FIGS. 9 and 15.

As described herein, a memory controller may include a hierarchical decoding architecture. For instance, a memory controller may include a first hierarchy of first decoders 1005 (e.g., when in some cases may be referred to herein as low-complexity ECC engines, or ECC0s). A memory controller may further include a second hierarchy of second decoders 1010 (e.g., ECC0s) and a third hierarchy of a third decoder 1015 (e.g., ECC2). Each of the first hierarchy, the second hierarchy, and the third hierarchy are further described herein, for example, with reference to FIGS. 13-15.

In an example scenario of a code structure with locality (e.g., and as further described with reference to FIG. 9), FIG. 10 shows a controller with 4 NAND channels being used. In some embodiments, S-Polar code may be used in a GCC with polar codes as inner codes and RS as outer codes. In the example of FIG. 10, there may be three hierarchies of locality (e.g., 4 KB, 16 KB, and 64 KB). For example, as shown in FIG. 10, a codeword of each hierarchy may include Data and overhead (OH). Moreover, each higher level hierarchy may include combined codewords of a preceding hierarchy. For instance, a combined codeword of a second hierarchy (e.g., that may be decoded via second decoders 1010) may include the combination of two codewords of the first hierarchy.

Figure 11:
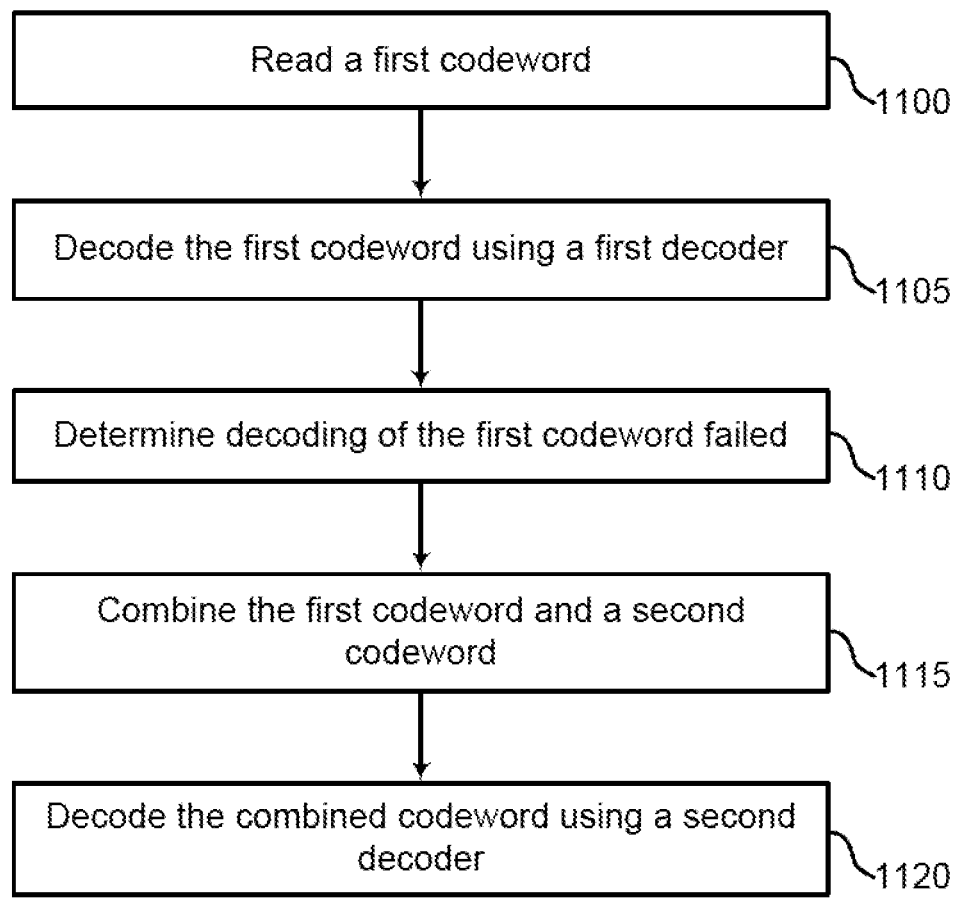
FIGS. 11 and 12 show examples of a process for hierarchical error code correction according to aspects of the present disclosure.

FIG. 11 shows an example of a process for hierarchical error code correction using according to aspects of the present disclosure. In some examples, these operations are performed by a system including a processor executing a set of codes to control functional elements of an apparatus. Additionally or alternatively, certain processes are performed using special-purpose hardware. Generally, these operations are performed according to the methods and processes described in accordance with aspects of the present disclosure. In some cases, the operations described herein are composed of various substeps, or are performed in conjunction with other operations.

At operation 1100, the system reads a first codeword from a first location of a memory device. In some cases, the operations of this step refer to, or may be performed by, a first decoder as described with reference to FIGS. 9, 10, and 13.

At operation 1105, the system performs a first decoding process on the first codeword using a first decoder. In some cases, the operations of this step refer to, or may be performed by, a first decoder as described with reference to FIGS. 9, 10, and 13.

At operation 1110, the system determines that the first codeword failed the first decoding process. In some cases, the operations of this step refer to, or may be performed by, a memory system as described with reference to FIG. 9, a decoder as described with reference to FIG. 10, or both.

At operation 1115, the system combines the first codeword and a second codeword to form a first combined codeword based on the determination that the first codeword failed the first decoding process. In some cases, the operations of this step refer to, or may be performed by, a memory system as described with reference to FIG. 9, a decoder as described with reference to FIG. 10, or both.

At operation 1120, the system performs a second decoding process on the first combined codeword using a second decoder. In some cases, the operations of this step refer to, or may be performed by, a second decoder as described with reference to FIGS. 9, 10, and 14.

Figure 12:
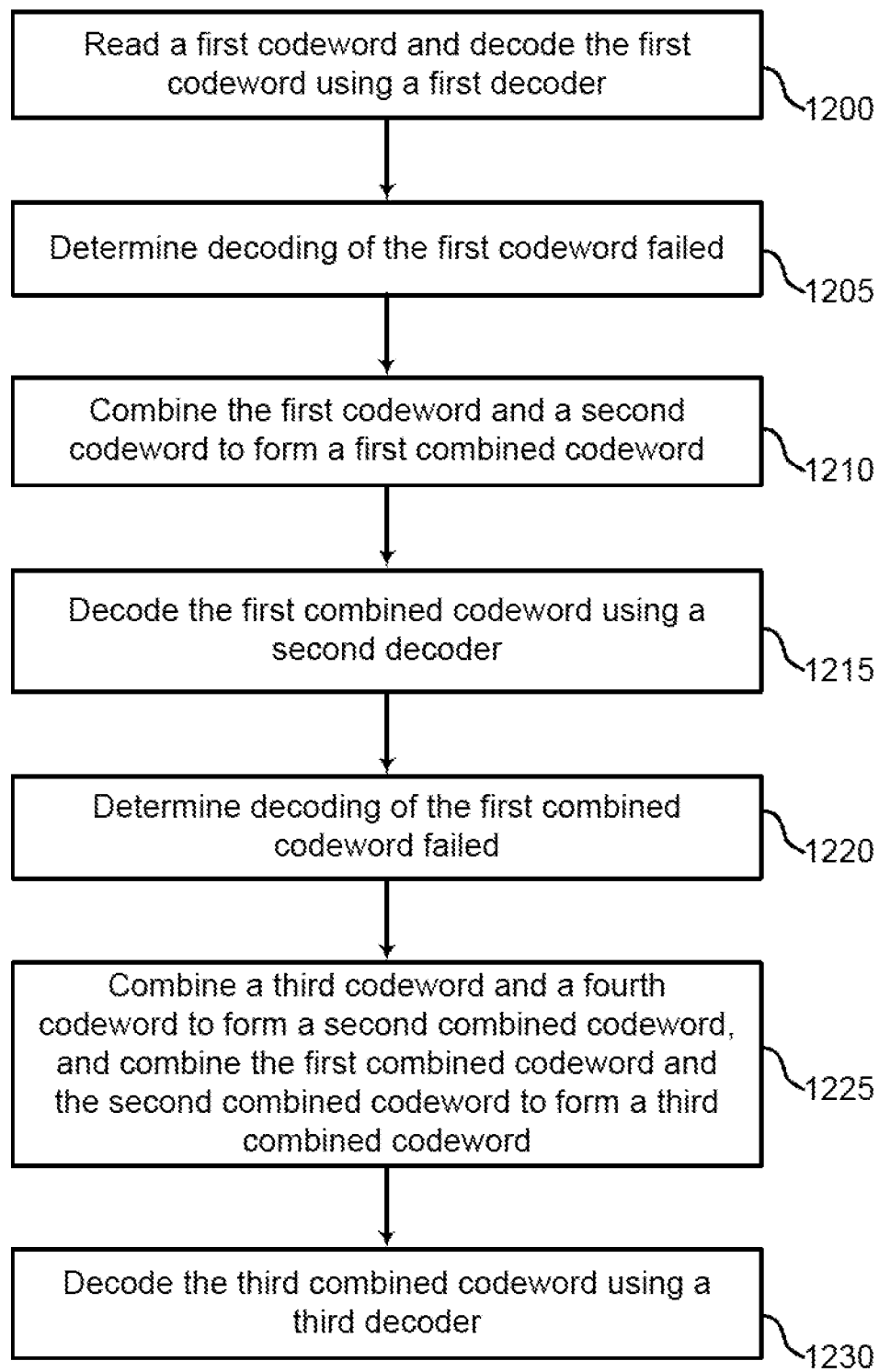

FIG. 12 shows an example of a process for hierarchical error code correction according to aspects of the present disclosure. In some examples, these operations are performed by a system including a processor executing a set of codes to control functional elements of an apparatus. Additionally or alternatively, certain processes are performed using special-purpose hardware. Generally, these operations are performed according to the methods and processes described in accordance with aspects of the present disclosure. In some cases, the operations described herein are composed of various substeps, or are performed in conjunction with other operations.

At operation 1200, the system reads a first codeword from a first location of a memory device and performing a first decoding process on the first codeword using a first decoder. In some cases, the operations of this step refer to, or may be performed by, a first decoder as described with reference to FIGS. 9, 10, and 13.

At operation 1205, the system determines that the first codeword failed the first decoding process. In some cases, the operations of this step refer to, or may be performed by, a memory system as described with reference to FIG. 9, a decoder as described with reference to FIG. 10, or both.

At operation 1210, the system combines the first codeword and a second codeword to form a first combined codeword based on the determination that the first codeword failed the first decoding process. In some cases, the operations of this step refer to, or may be performed by, a memory system as described with reference to FIG. 9, a decoder as described with reference to FIG. 10, or both.

At operation 1215, the system performs a second decoding process on the first combined codeword using a second decoder. In some cases, the operations of this step refer to, or may be performed by, a second decoder as described with reference to FIGS. 9, 10, and 14.

At operation 1220, the system determines that the first combined codeword failed the second decoding process. In some cases, the operations of this step refer to, or may be performed by, a memory system as described with reference to FIG. 9, a decoder as described with reference to FIG. 10, or both.

At operation 1225, the system combines a third codeword and a fourth codeword to form a second combined codeword, and combining the first combined codeword and the second combined codeword to form a third combined codeword. In some cases, the operations of this step refer to, or may be performed by, a memory system as described with reference to FIG. 9.

At operation 1230, the system performs a third decoding process on the third combined codeword. In some cases, the operations of this step refer to, or may be performed by, a third decoder as described with reference to FIGS. 9, 10, and 15.

Hierarchical Data Structure

Figure 13:
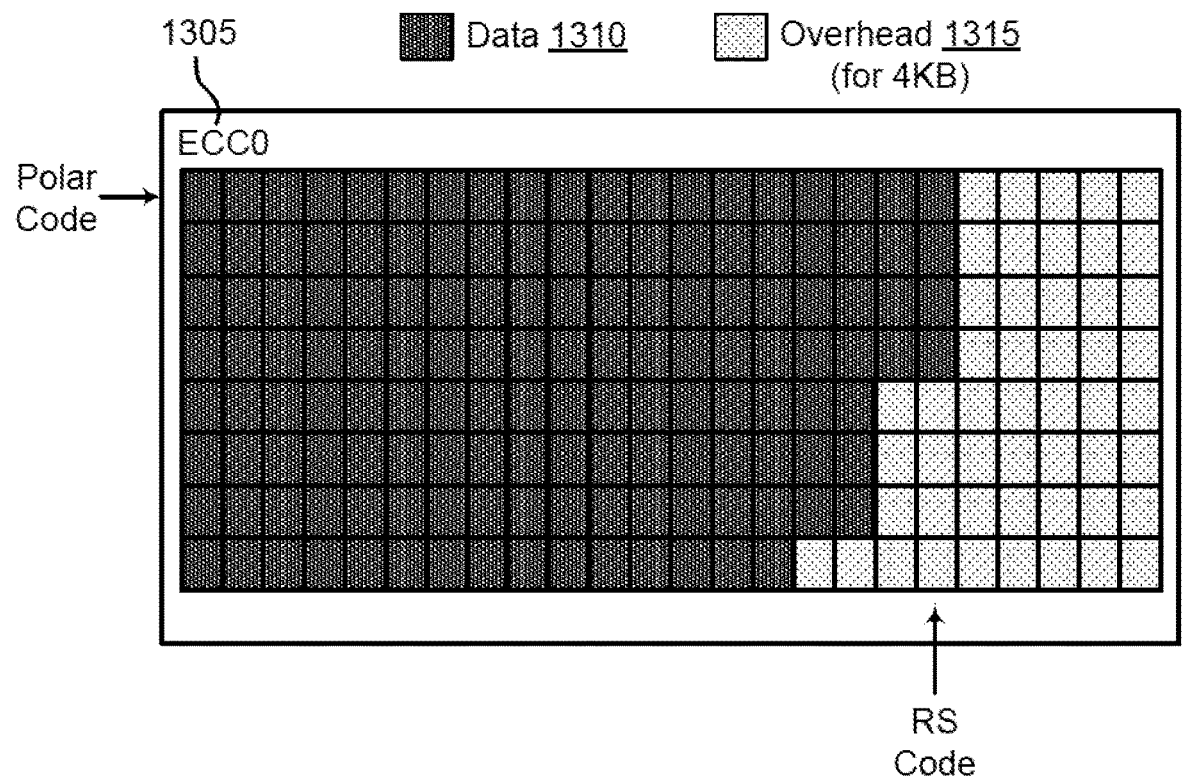
FIG. 13 shows an example of a first decoding hierarchy according to aspects of the present disclosure.
Figure 14:
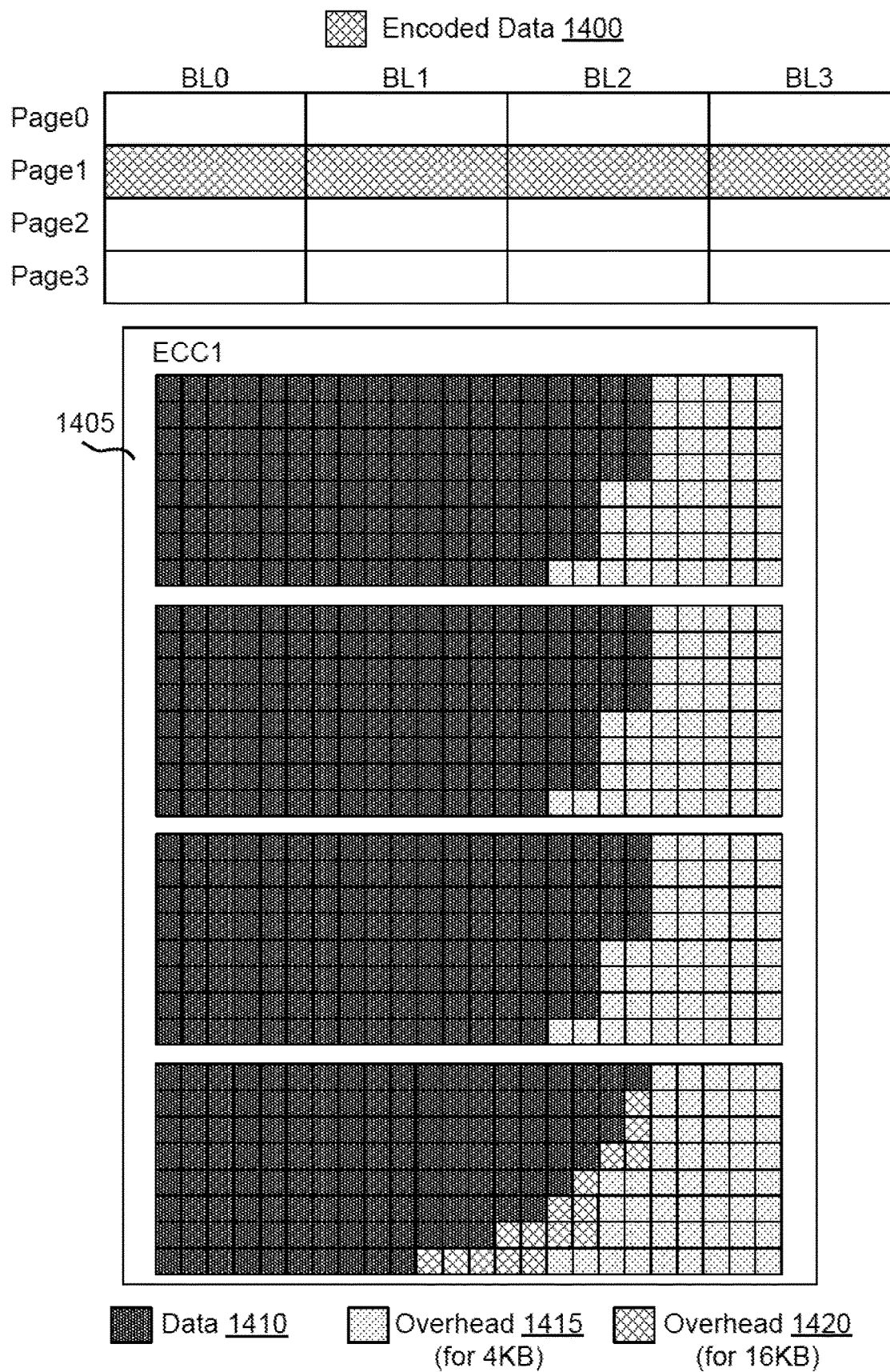
FIG. 14 shows an example of a second decoding hierarchy according to aspects of the present disclosure.
Figure 15:
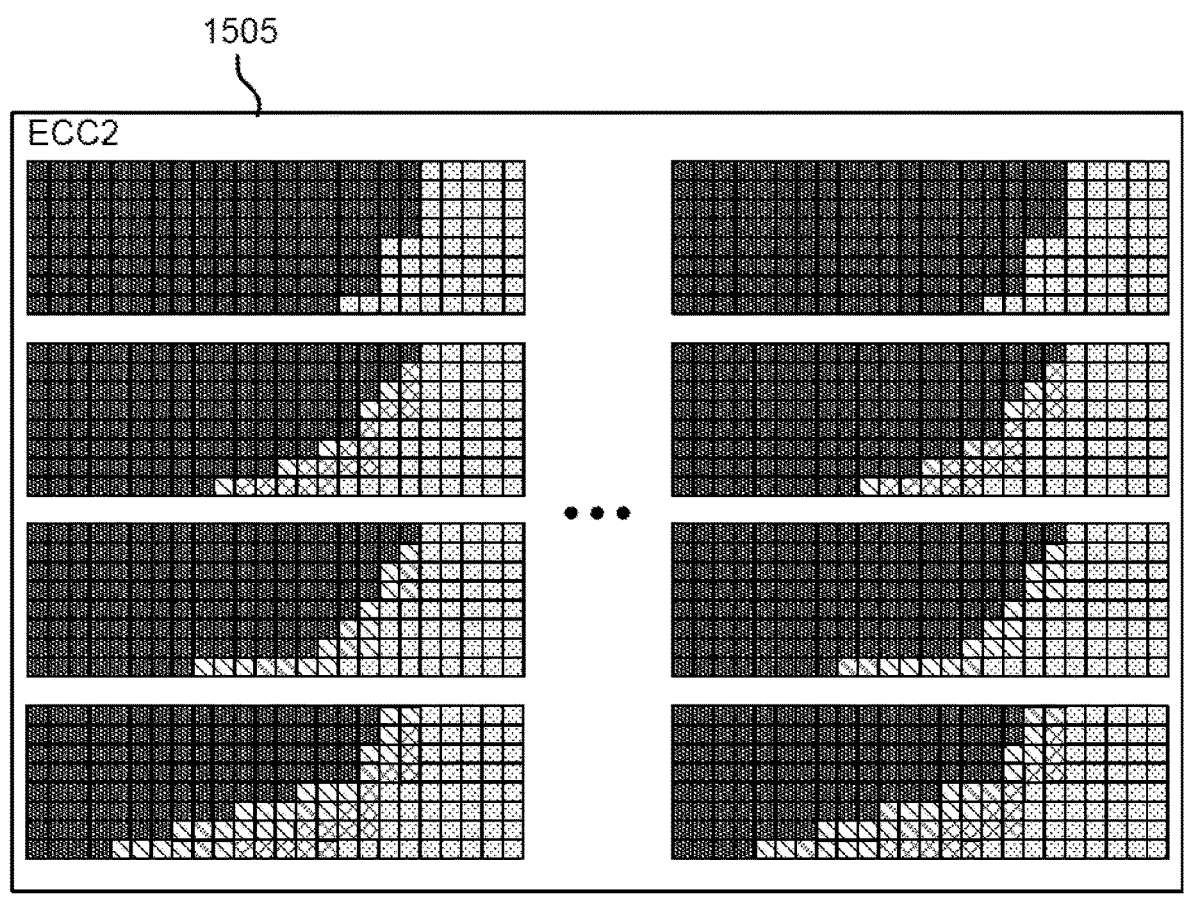
FIG. 15 shows an example of a third decoding hierarchy according to aspects of the present disclosure.

FIGS. 13-15 show example hierarchical decoding structure that may be implemented according to aspects of the present disclosure. As described, memory controllers may be implemented according to a hierarchical decoding architecture. As described below, (e.g., with reference to FIGS. 13-15) hierarchical code is planned such that each hierarchy achieves throughput and correctability performance. For instance, lower hierarchies may be implemented for applying fast reads from the NAND and fast decoding techniques, while higher hierarchies may be implemented less frequently (e.g., for more complex decoding operations, when more powerful decoding schemes are desired, when lower hierarchy decoding schemes fail, etc.). Such may enable the use of long codes and complex hardware with acceptable hardware complexity.

FIG. 13 shows an example of a first decoding hierarchy according to aspects of the present disclosure. The example shown includes encoded data 1300, first decoder 1305, data bits 1310, and overhead bits 1315. Encoded data 1300 is an example of, or includes aspects of, the corresponding element described with reference to FIGS. 14 and 15. First decoder 1305 is an example of, or includes aspects of, the corresponding element described with reference to FIGS. 9 and 10. Data bits 1310 is an example of, or includes aspects of, the corresponding element described with reference to FIGS. 14 and 15. Overhead bits 1315 is an example of, or includes aspects of, the corresponding element described with reference to FIGS. 14 and 15.

The first hierarchy may be encoded using triple level cell (TLC) Balanced Gray-Mapping on a Word-Line page Bit-Lines using an S-Polar encoder. For example, TLC Balanced Gray-Mapping may be used on ¼ of a word line page bit lines (e.g., encoded data 1300 may refer to data encoded on ¼ of bit lines and on a single logical page). The S-Polar code length may take up a certain amount of memory and the S-Polar structure is optimized for Hard Decision (HD) data (one bit per cell), where decoding may result in a frame error rate (FER) of, for example, 1e-5. For example, the code length may be 4 KB plus overhead, where overhead is any excessive or indirect computation time. The first hierarchy decodes HD data using a fast Believe-Propagation (BP) polar decoder and fast HD RS Decoder. As a result, errors and erasures may be corrected.

FIG. 14 shows an example of a second decoding hierarchy according to aspects of the present disclosure. The example shown includes encoded data 1400, second decoder 1405, data bits 1410, overhead bits 1415, and overhead bits 1420. Encoded data 1400 is an example of, or includes aspects of, the corresponding element described with reference to FIGS. 13 and 15. Second decoder 1405 is an example of, or includes aspects of, the corresponding element described with reference to FIGS. 9 and 10. Data bits 1410 is an example of, or includes aspects of, the corresponding element described with reference to FIGS. 13 and 15. Overhead bits 1415 is an example of, or includes aspects of, the corresponding element described with reference to FIGS. 13 and 15.

The second hierarchy is a generalized concatenation of 4 S-Polar Codes from the first hierarchy and includes data from the same word line and page and some or all bit lines (e.g., encoded data 1400 may include data encoded on all bit lines and on a single logical page). The decoder is based on a polar list decoder and a HD RS Decoder, supporting Soft Chase decoding. In an example scenario, the polar list decoder may have a list length of 16. The code length may be 16 KB plus overhead, and the additional overhead is optimized for 3SD decoding (3 bits per cell), resulting in an FER of 1e-10. The optimization may be performed by adding additional overhead in the GCC structure, such that the hierarchy may achieve throughput and correctability performance.

FIG. 15 shows an example of a third decoding hierarchy according to aspects of the present disclosure. The example shown includes encoded data 1500, third decoder 1505, data bits 1510, overhead bits 1515, overhead bits 1520, and overhead bits 1525. Encoded data 1500 is an example of, or includes aspects of, the corresponding element described with reference to FIGS. 13 and 14. Third decoder 1505 is an example of, or includes aspects of, the corresponding element described with reference to FIGS. 9 and 10. Data bits 1510 is an example of, or includes aspects of, the corresponding element described with reference to FIGS. 13 and 14. Overhead bits 1515 may be examples of, or includes aspects of, the corresponding elements described with reference to FIGS. 13 and 14.

The third hierarchy is a generalized concatenation of S-Polar codes from the first hierarchy and may include some or all data from the word line. The encoded data 1500 may include, for example, data encoded on all bit lines and on all logical pages. For example, 16 S-Polar codes may be used. For reference, channel equalization considers interference from adjacent bit lines. The decoder includes a channel equalization component, a polar list decoder with a list length, and a Soft-Decision (SD) RS Decoder. The polar list decoder may have a list length of 64, but the present disclosure is not limited thereto. The code length may be 64 KB plus overhead and the additional overhead is optimized for 4SD decoding after channel equalization. The optimization may be performed by adding additional overhead in the GCC structure, such that the hierarchy may achieve throughput and correctability performance Accordingly, the present disclosure includes the following embodiments.

A method for hierarchical error code correction is described. Embodiments of the method are configured to reading a first codeword from a first location of a memory device, performing a first decoding process on the first codeword using a first decoder, determining that the first codeword failed the first decoding process, combining the first codeword and a second codeword to form a first combined codeword based on the determination that the first codeword failed the first decoding process, and performing a second decoding process on the first combined codeword using a second decoder.

An apparatus for hierarchical error code correction is described. The apparatus includes a processor, memory in electronic communication with the processor, and instructions stored in the memory. The instructions are operable to cause the processor to read a first codeword from a first location of a memory device, perform a first decoding process on the first codeword using a first decoder, determine that the first codeword failed the first decoding process, combine the first codeword and a second codeword to form a first combined codeword based on the determination that the first codeword failed the first decoding process, and perform a second decoding process on the first combined codeword using a second decoder.

A non-transitory computer readable medium storing code for hierarchical error code correction is described. In some examples, the code comprises instructions executable by a processor to read a first codeword from a first location of a memory device, perform a first decoding process on the first codeword using a first decoder, determine that the first codeword failed the first decoding process, combine the first codeword and a second codeword to form a first combined codeword based on the determination that the first codeword failed the first decoding process, and perform a second decoding process on the first combined codeword using a second decoder.

A system for hierarchical error code correction is described. Embodiments of the system are configured to reading a first codeword from a first location of a memory device, performing a first decoding process on the first codeword using a first decoder, determining that the first codeword failed the first decoding process, combining the first codeword and a second codeword to form a first combined codeword based on the determination that the first codeword failed the first decoding process, and performing a second decoding process on the first combined codeword using a second decoder.

Some examples of the method, apparatus, non-transitory computer readable medium, and system described above further include determining that the first combined codeword failed the second decoding process. Some examples further include combining a third codeword and a fourth codeword to form a second combined codeword. Some examples further include combining the first combined codeword and the second combined codeword to form a third combined codeword. Some examples further include performing a third decoding process on the third combined codeword using a third decoder.

In some examples, the memory device comprises a NAND memory device. In some examples, the first codeword and the second codeword are read from a same word line of the memory device. In some examples, the first codeword and the second codeword are read from a same page of the memory device. In some examples, the first decoding process is performed based on a first algorithm, and the second decoding process is performed based on a second algorithm having a high complexity than the first algorithm.

In some examples, the first decoding algorithm is based on a GCC comprising an inner polar code and an outer RS code. In some examples, the first decoding algorithm is based on a GTP comprising an inner BCH code and an outer RS code. In some examples, the first codeword comprises first error correction bits for the first decoding process and second error correction bits for the second decoding process. In some examples, the second codeword comprises third error correction bits for the second decoding process.

Some examples of the method, apparatus, non-transitory computer readable medium, and system described above further include encoding first data and the second data separately using a first encoding process. Some examples further include encoding the first data and the second data together using a second encoding process, wherein the first codeword corresponds to the first data and the second codeword corresponds to the second data.

Some examples of the method, apparatus, non-transitory computer readable medium, and system described above further include combining the first codeword and the second codeword with a third codeword and a fourth codeword to form the first combined codeword.

A method for hierarchical error code correction is described. Embodiments of the method are configured to receiving data for storage in a memory device, generating a combined codeword based on an inner coding scheme and an outer coding scheme, wherein a first portion of the combined codeword and a second portion of the combined codeword are encoded separately using the inner coding scheme and jointly using the outer coding scheme, and storing the first portion of the combined codeword at a first location of the memory device and the second portion of the combined codeword at a second location of the memory device.

An apparatus for hierarchical error code correction is described. The apparatus includes a processor, memory in electronic communication with the processor, and instructions stored in the memory. The instructions are operable to cause the processor to receive data for storage in a memory device, generate a combined codeword based on an inner coding scheme and an outer coding scheme, wherein a first portion of the combined codeword and a second portion of the combined codeword are encoded separately using the inner coding scheme and jointly using the outer coding scheme, and store the first portion of the combined codeword at a first location of the memory device and the second portion of the combined codeword at a second location of the memory device.

A non-transitory computer readable medium storing code for hierarchical error code correction is described. In some examples, the code comprises instructions executable by a processor to: receive data for storage in a memory device, generate a combined codeword based on an inner coding scheme and an outer coding scheme, wherein a first portion of the combined codeword and a second portion of the combined codeword are encoded separately using the inner coding scheme and jointly using the outer coding scheme, and store the first portion of the combined codeword at a first location of the memory device and the second portion of the combined codeword at a second location of the memory device.

A system for hierarchical error code correction is described. Embodiments of the system are configured to receiving data for storage in a memory device, generating a combined codeword based on an inner coding scheme and an outer coding scheme, wherein a first portion of the combined codeword and a second portion of the combined codeword are encoded separately using the inner coding scheme and jointly using the outer coding scheme, and storing the first portion of the combined codeword at a first location of the memory device and the second portion of the combined codeword at a second location of the memory device.

In some examples, the first location and the second location correspond to different bit lines within a same logical page of the memory device. In some examples, the inner coding scheme comprises a polar coding scheme. In some examples, the outer coding scheme comprises a RS coding scheme. In some examples, the combined codeword is generated based on feedback comprising frozen bits. In some examples, the inner coding scheme comprises a BCH coding scheme. In some examples, the outer coding scheme comprises a RS coding scheme. In some examples, the combined codeword is generated based on feedback comprising delta syndrome bits.

An apparatus for hierarchical error code correction is described. Embodiments of the apparatus are configured to a memory device, a first decoder configured to perform a first decoding process on a first codeword read from the memory device, and a second decoder configured to perform a second decoding process on a first combined codeword comprising the first codeword and a second codeword read from the memory device when the first codeword fails the first decoding process.

A system for hierarchical error code correction, comprising: a memory device, a first decoder configured to perform a first decoding process on a first codeword read from the memory device, and a second decoder configured to perform a second decoding process on a first combined codeword comprising the first codeword and a second codeword read from the memory device when the first codeword fails the first decoding process.

A method of manufacturing an apparatus for hierarchical error code correction is described. The method includes manufacturing a memory device, a first decoder configured to perform a first decoding process on a first codeword read from the memory device, and a second decoder configured to perform a second decoding process on a first combined codeword comprising the first codeword and a second codeword read from the memory device when the first codeword fails the first decoding process.

A method of using an apparatus for hierarchical error code correction is described. The method includes using a memory device, a first decoder configured to perform a first decoding process on a first codeword read from the memory device, and a second decoder configured to perform a second decoding process on a first combined codeword comprising the first codeword and a second codeword read from the memory device when the first codeword fails the first decoding process.

Some examples of the apparatus, system, and method described above further include a third decoder configured to perform a third decoding process on a third combined codeword comprising the first combined codeword and a second combined codeword when the first combined codeword fails the second decoding process, wherein the second combined codeword comprises a third codeword and a fourth codeword read from the memory device.

Some examples of the apparatus, system, and method described above further include a first encoder configured to encode first data and second data separately. Some examples further include a second encoder configured to encode the first data and the second data together.

Some examples of the apparatus, system, and method described above further include a third encoder configured to encode the first and second data together with third data and fourth data, wherein the third data and the fourth data are encoded by the first encoder separately, and wherein the third data and the fourth data are encoded by the second encoder together.

The description and drawings described herein represent example configurations and do not represent all the implementations within the scope of the claims. For example, the operations and steps may be rearranged, combined or otherwise modified. Also, structures and devices may be represented in the form of block diagrams to represent the relationship between components and avoid obscuring the described concepts. Similar components or features may have the same name but may have different reference numbers corresponding to different figures.

Some modifications to the disclosure may be readily apparent to those skilled in the art, and the principles defined herein may be applied to other variations without departing from the scope of the disclosure. Thus, the disclosure is not limited to the examples and designs described herein, but is to be accorded the broadest scope consistent with the principles and novel features disclosed herein.

The described methods may be implemented or performed by devices that include a general-purpose processor, a digital signal processor (DSP), an application specific integrated circuit (ASIC), a field programmable gate array (FPGA) or other programmable logic device, discrete gate or transistor logic, discrete hardware components, or any combination thereof. A general-purpose processor may be a microprocessor, a conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration). Thus, the functions described herein may be implemented in hardware or software and may be executed by a processor, firmware, or any combination thereof. If implemented in software executed by a processor, the functions may be stored in the form of instructions or code on a computer-readable medium.

Computer-readable media includes both non-transitory computer storage media and communication media including any medium that facilitates transfer of code or data. A non-transitory storage medium may be any available medium that can be accessed by a computer. For example, non-transitory computer-readable media can comprise random access memory (RAM), read-only memory (ROM), electrically erasable programmable read-only memory (EEPROM), compact disk (CD) or other optical disk storage, magnetic disk storage, or any other non-transitory medium for carrying or storing data or code.

Also, connecting components may be properly termed computer-readable media. For example, if code or data is transmitted from a website, server, or other remote source using a coaxial cable, fiber optic cable, twisted pair, digital subscriber line (DSL), or wireless technology such as infrared, radio, or microwave signals, then the coaxial cable, fiber optic cable, twisted pair, DSL, or wireless technology are included in the definition of medium. Combinations of media are also included within the scope of computer-readable media.

In this disclosure and the following claims, the word "or" indicates an inclusive list such that, for example, the list of X, Y, or Z means X or Y or Z or XY or XZ or YZ or XYZ. Also the phrase "based on" is not used to represent a closed set of conditions. For example, a step that is described as "based on condition A" may be based on both condition A and condition B. In other words, the phrase "based on" shall be construed to mean "based at least in part on." Also, the words "a" or "an" indicate "at least one."

What is claimed is:

1. A method for flash memory error code correction, comprising:
    reading a first codeword from a first location of a memory device;
    performing a first decoding process on the first codeword using a first decoder;
    determining that the first codeword failed the first decoding process;
    combining the first codeword and a second codeword to form a first combined codeword based on the determination that the first codeword failed the first decoding process; and
    performing a second decoding process on the first combined codeword using a second decoder.

2. The method of claim 1, further comprising:
    determining that the first combined codeword failed the second decoding process;
    combining a third codeword and a fourth codeword to form a second combined codeword;
    combining the first combined codeword and the second combined codeword to form a third combined codeword; and
    performing a third decoding process on the third combined codeword using a third decoder.

3. The method of claim 1, wherein:
the memory device comprises a NAND memory device.

4. The method of claim 1, wherein:
the first codeword and the second codeword are read from a same word line of the memory device.

5. The method of claim 4, wherein:
the first codeword and the second codeword are read from a same page of the memory device.

6. The method of claim 1, wherein:
the first decoding process is performed based on a first algorithm, and the second decoding process is performed based on a second algorithm having a high complexity than the first algorithm.

7. The method of claim 1, wherein:
the first decoding process is based on a Generalized Concatenated code (GCC) comprising an inner polar code and an outer Reed-Solomon (RS) code.

8. The method of claim 1, wherein:
the first decoding process is based on a Generalized Tensor Product code (GTP) comprising an inner Bose-Chaudhuri-Hocquenghem (BCH) code and an outer Reed-Solomon (RS) code.

9. The method of claim 1, wherein:
the first codeword comprises first error correction bits for the first decoding process and second error correction bits for the second decoding process.

10. The method of claim 9, wherein:
the second codeword comprises third error correction bits for the second decoding process.

11. The method of claim 1, further comprising:
encoding first data and second data separately using a first encoding process; and
encoding the first data and the second data together using a second encoding process, wherein the first codeword corresponds to the first data and the second codeword corresponds to the second data.

12. The method of claim 1, further comprising:
combining the first codeword and the second codeword with a third codeword and a fourth codeword to form the first combined codeword.

13. A method for flash memory error code correction, comprising:
receiving data for storage in a memory device;
generating a combined codeword based on an inner coding scheme and an outer coding scheme, wherein a first portion of the combined codeword and a second portion of the combined codeword are encoded using the inner coding scheme and using the outer coding scheme; and
storing the first portion of the combined codeword at a first location of the memory device and the second portion of the combined codeword at a second location of the memory device.

14. The method of claim 13, wherein:
the first location and the second location correspond to different bit lines within a same logical page of the memory device.

15. The method of claim 13, wherein:
the inner coding scheme comprises a polar coding scheme;
the outer coding scheme comprises a Reed-Solomon (RS) coding scheme; and
the combined codeword is generated based on feedback comprising frozen bits.

16. The method of claim 13, wherein:
the inner coding scheme comprises a Bose-Chaudhuri-Hocquenghem (BCH) coding scheme;
the outer coding scheme comprises a Reed-Solomon (RS) coding scheme; and
the combined codeword is generated based on feedback comprising delta syndrome bits.

17. An apparatus for flash memory error code correction, comprising:
a memory device;
a first decoder configured to perform a first decoding process on a first codeword read from the memory device; and
a second decoder configured to perform a second decoding process on a first combined codeword comprising the first codeword and a second codeword read from the memory device when the first codeword fails the first decoding process.

18. The apparatus of claim 17, further comprising:
a third decoder configured to perform a third decoding process on a third combined codeword comprising the first combined codeword and a second combined codeword when the first combined codeword fails the second decoding process, wherein the second combined codeword comprises a third codeword and a fourth codeword read from the memory device.

19. The apparatus of claim 17, further comprising:
a first encoder configured to encode first data and second data separately; and
a second encoder configured to encode the first data and the second data together.

20. The apparatus of claim 19, further comprising:
a third encoder configured to encode the first and second data together with third data and fourth data, wherein the third data and the fourth data are encoded by the first encoder, and wherein the third data and the fourth data are encoded by the second encoder.

* * * * *